United States Patent [19]
Yamamoto

[11] Patent Number: 5,898,206
[45] Date of Patent: Apr. 27, 1999

[54] SEMICONDUCTOR DEVICE

[75] Inventor: Yuhide Yamamoto, Tokyo, Japan

[73] Assignee: NEC Corporation, Tokyo, Japan

[21] Appl. No.: 08/997,719

[22] Filed: Dec. 23, 1997

[30] Foreign Application Priority Data

Dec. 26, 1996 [JP] Japan ..................................... 8-347828

[51] Int. Cl.⁶ .................................................. H01L 23/62
[52] U.S. Cl. ............................................ 257/360; 257/379
[58] Field of Search ................... 257/360, 379, 257/382, 395

[56] References Cited

FOREIGN PATENT DOCUMENTS 3-79080  4/1991  Japan .

*Primary Examiner*—Mark V. Prenty
*Attorney, Agent, or Firm*—Foley & Lardner

[57] ABSTRACT

A MOSLSI in which a surface of a diffused layer is formed from silicide is improved in electrostatic breakdown voltage to raise the reliability thereof. The MOSLSI includes input and output protection elements each formed from MOS transistors. Each of the MOS transistors includes a field oxide film formed between a drain diffused layer and a gate electrode such that the gate electrode partially extends to a location on the field oxide film. A well having a conduction type same as that of the drain diffused layer is formed below a region which includes the field oxide film and the drain diffused layer. Since a lower portion of the field oxide film exhibits a high resistance, even if a silicide layer having a low resistance is formed on the surface of the diffused layer, the breakdown voltage of the transistor is maintained high. Consequently, local heat generation by a surge is prevented and a high electrostatic breakdown voltage can be achieved.

13 Claims, 19 Drawing Sheets

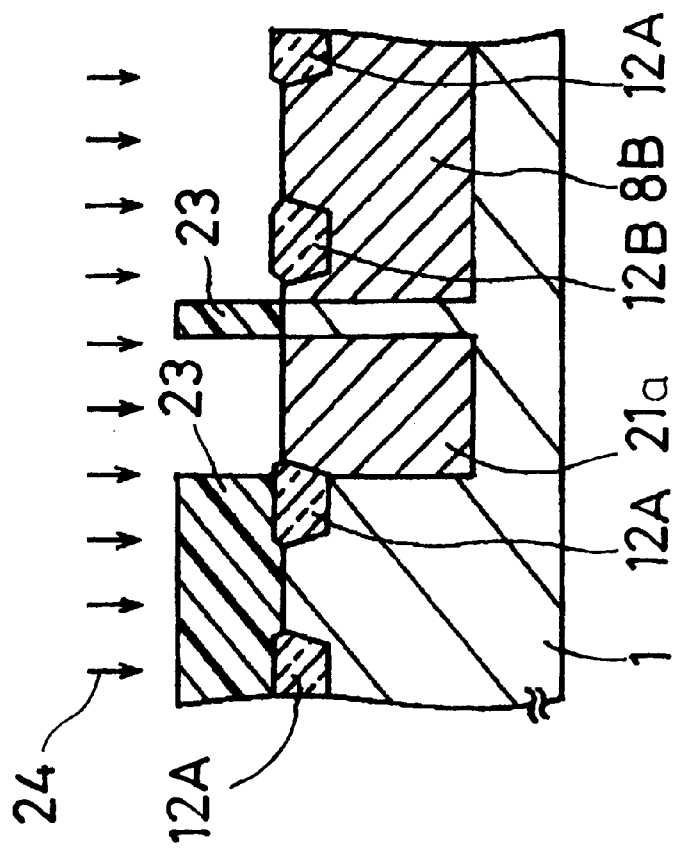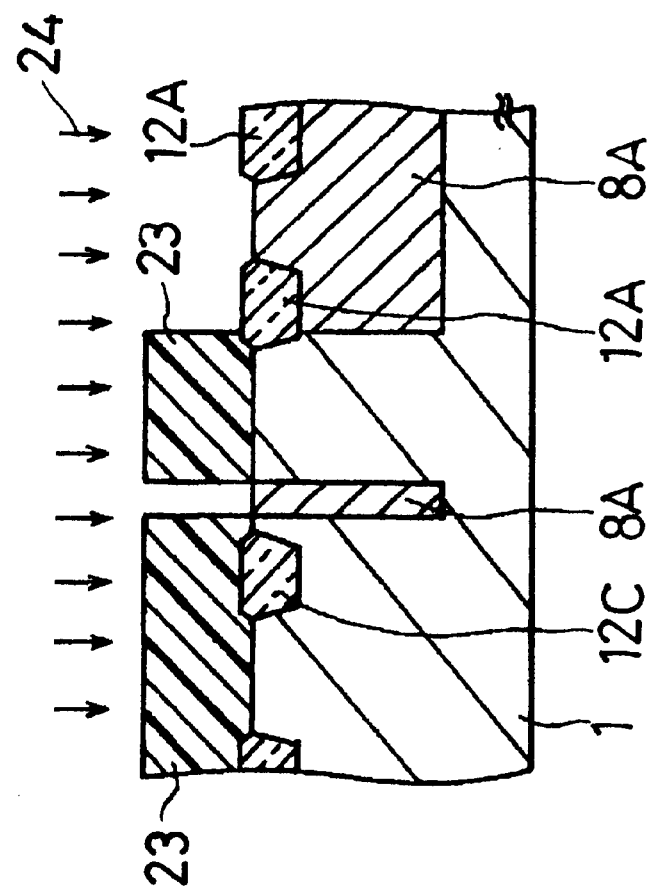
FIG. 11 (a)
FIG. 11 (b)

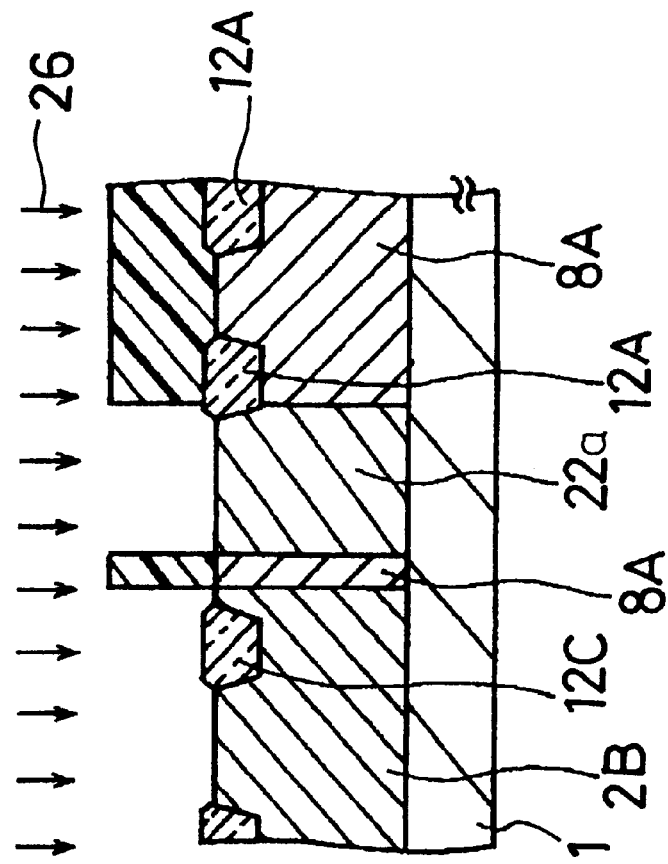
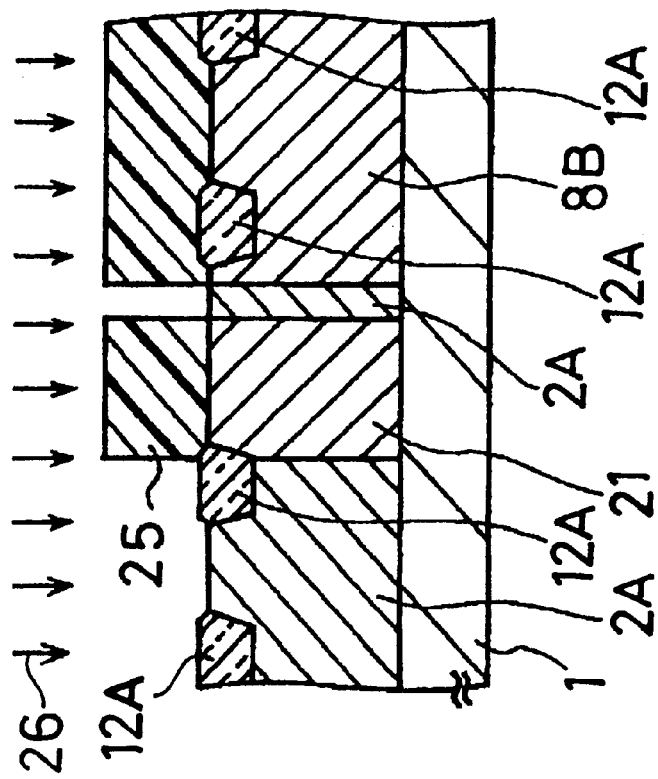

SEMICONDUCTOR DEVICE

BACKGROUND OF THE INVENTION

1. Field of the Invention

This invention relates to a semiconductor device, and more particularly to a semiconductor integrated circuit device which includes MOS transistors and has input and output protection circuits built therein.

2. Description of the Related Art

In a semiconductor integrated circuit device such as, for example, a MOSLSI, in order to prevent possible breakdown of an internal circuit element thereof by a surge of static electricity or the like applied to an input/output terminal (abbreviation of an input terminal or output terminal) thereof, an input/output protection circuit (abbreviation of an input protection circuit or output protection circuit) is provided between an input/output terminal and an internal circuit. Generally, an input protection circuit and an output protection circuit are each formed from a CMOS circuit wherein an N-channel transistor N1 and a P-channel transistor P1 are connected in series between a power supply potential VDD and a ground potential GND as seen in FIGS. 15(a) and 15(b), respectively.

Meanwhile, in a MOS transistor which forms a semiconductor integrated circuit device in recent years, in order to realize high integration and high speed operation, the gate electrode is formed finely to a dimension of half micron or less and a gate insulating film is formed as a thin film of 10 to 20 nm or less.

Further, in order to reduce the resistance of a diffused layer of the source and the drain or of the gate electrode, a metal silicide technique is employed. By a metal silicide technique, the resistance of the diffused layer is reduced from 100 to 200 $\Omega/\mu m^2$ to 5 to 10 $\Omega/\mu m^2$, that is, to approximately one twentieth.

A plan view of the input/output protection circuit shown in FIGS. 15(a) or 15(b) where it is formed on a semiconductor substrate using MOS transistors formed using the metal silicide technique is shown in FIG. 16 while sectional views taken along line A—A and line B—B in FIG. 16 are shown in FIGS. 17(a) and 17(b), respectively. Referring to FIGS. 16, 17(a) and 17(b), a P well 2A is provided on a surface of a P-type silicon semiconductor substrate 1, and the N-channel transistor is formed on the P well 2A and includes N$^+$-type diffused layers 3A and 3B, an N$^-$-type diffused layer 4, a gate insulating film 5, side wall spacers 6 and gate electrodes 7N made of a polycrystalline silicon layer. The P-channel transistor is formed from an N well 8A, P$^+$-type diffused layers 9A and 9B, a P$^-$-type diffused layer 10, the gate insulating film 5, the side wall spacers 6 and gate electrodes 7P. Further, in order to connect a GND terminal 17 to the P well 2A and connect a VDD terminal 19 to the N well 8A, a P$^+$ diffused layer 9C and an N$^+$ diffused layer 3C are formed, respectively. For example, a titanium silicide layer 11 is formed on the surfaces of the diffused layers 3A, 3B and and 9A, 9B and 9C by conversion into metal silicide. A field oxide film 12A isolates the N-channel transistor, the P-channel transistor and grounding portions of the wells from each other. An inter-layer insulating film 13 has contact holes 14NS, 14ND, 14NW, 14PS, 14PD and 14PW formed therein on the N$^+$-type diffused layers 3A, 3B, 3C, 9A, 9B and 9C, and metal electrodes 15NS, 15ND, 15NW, 15PS, 15PD and 15PW of the first layer are formed in the contact holes 14NS, 14ND, 14NW, 14PS, 14PD and 14PW, respectively. Similarly, the gate electrodes 7N and 7P are connected to metal wires 30N and 30P, respectively, of the second layer which selectively covers over an inter-layer insulating film not shown.

The N$^+$-type diffused layer 3A which provides source regions for the four N-channel transistors is individually connected to the metal electrodes 15NS, connected to the metal electrodes 15PW which are connected to the P$^+$ diffused layer 9C which is the contact region of the P well 2A, and further connected to the GND terminal 17. The N$^+$-type diffused layer 3B which provides the drain regions for the N-channel transistors is connected commonly by the metal electrodes 15ND similarly and connected to either one of an input terminal IN (refer to FIG. 15(a)) and an output terminal OUT (refer to FIG. 15(b)). The gate electrodes 7N of the N-channel transistors are connected to either one of the GND terminal 17 (refer to FIG. 15(a)) and an internal element not shown (refer to FIG. 15(b)) by the metal wire 30N.

The P$^+$-type diffused layer 9A which provides source regions for the four P-channel transistors is individually connected to the metal electrodes 15PS, connected to the metal electrodes 15NW which are connected to the N$^+$ diffused layer 3C which is the contact region of the N well 8A, and further connected to the VDD terminal 19. The P$^+$-type diffused layer 9B which provides the drain regions for the N-channel transistors is connected commonly by the metal electrodes 15PD similarly and connected to either one of the input terminal IN (refer to FIG. 15(a)) and the output terminal OUT (refer to FIG. 15(b)). The gate electrodes 7P of the P-channel transistors are connected to either one of the VDD terminal 19 (refer to FIG. 15(a)) and another internal element not shown (refer to FIG. 15(b)) by the metal wires 30P.

Operation when an external surge is applied to an input/output terminal 18 is described now. A strength test of an electrostatic breakdown withstanding voltage by an external surge is performed such that a testing apparatus is connected to the output terminal 18 and a positive or negative surge is applied to the GND terminal 17 and the VDD terminal 19. First, when a surge is applied as a negative voltage to the GND terminal 17, since this acts as a forward voltage to the PN junction between the N$^+$-type diffused layer 3B and the P well 2A, the forward PN junction is turned on. Then, the surge passes from the GND terminal 17 through the P$^+$ diffused layer 9C, P well 2A and N$^+$-type diffused layer 3B and flows to the input/output terminal 18. Then, when a surge is applied as a positive voltage to the GND terminal 17, since this corresponds to a case wherein a positive voltage is applied to the drains with respect to the sources of the N-channel transistors, breakdown occurs at locations immediately below end portions of the gates adjacent the drains, that is, at locations of the N$^-$-type diffused layer 4, by a potential difference between the drain regions (3B) and the gate electrodes 7N of the N-channel transistors. After the breakdown, current flows from the drain regions (N$^+$-type diffused layer 3B) to the P well 2A. Thus, the current raises the potential at the P well 2A to a positive potential, and as a result, a forward voltage is applied to the PN junctions between the P well 2A and the source regions (N$^+$-type diffused layer 3A) and the PN junctions are turned on. Consequently, the current flows from the drain regions (N$^+$-type diffused layer 3B) to the source regions (N$^+$-type diffused layer 3A). In other words, NPN parasitic bipolar transistors wherein the collectors are provided by the drain regions (N$^+$-type diffused layer 3B), the bases are provided by the P well 2A and the emitters are provided by the N$^+$-type diffused layer 3A are turned on, and consequently, the surge flows from the input/output terminal 18 through the N$^+$-type diffused layer 3B, P well 2A and N$^+$-type diffused layer 3A to the GND terminal 17. Then, when a surge is applied as a positive voltage to the VDD terminal 19, since the PN junction between the P$^+$-type diffused layer 9B and the N well 8A is turned on by a forward voltage, the surge flows from the input/output terminal 18 through the P$^+$-type diffused layer 9B, N well 8A and N$^+$ diffused layer 3C to the VDD terminal 19. When a surge is applied as a negative voltage to the VDD terminal 19, a phenomenon similar to that which occurs with the N-channel transistors as described above occurs with the P-channel transistors, and PNP parasitic transistors formed from the drain region (P$^+$-type diffused layer 9B), N well 8A and source region (P$^{30}$-type diffused layer 9A) are turned on. Consequently, the surge flows from the VDD terminal 19 through the P$^+$-type diffused layer 9A, N well 8A and P$^+$-type diffused layer 9B to the input/output terminal 18.

As described above, when an external surge is applied to the input/output terminal 18, the surge is discharged as current flows between the input/output terminal 18 and the GND terminal 17 or the VDD terminal 19, thereby protecting the internal circuit elements.

On the other hand, if an external surge is applied as a positive voltage to the GND terminal 17 or applied as a negative voltage to the VDD terminal 19, the NPN or PNP parasitic bipolar transistors are turned on to allow current to flow between the sources and the drains of the transistors. In this instance, however, heat is generated by resistances between the sources and the drains. In order to prevent melting or breakdown of the heat generating portions by the thus generated heat, that is, in order to increase the allowable amount of the on-current, a transistor of an input/output protection circuit generally has a large gate width of several hundreds microns. A transistor having such a large gate width is actually formed from a plurality of transistors arranged in parallel to each other and designed such that, in a layout thereof on a plane, they have an equal gate width 29 as seen in FIG. 16.

It is described above that, in the conventional semiconductor device described above, if an external surge is applied as a positive voltage to the GND terminal 17 or applied as a negative voltage to the VDD terminal 19, parasitic bipolar transistors are turned on and current flows between the sources and the drains of the transistors. Here, if notice is taken of a case wherein a surge is applied as a positive voltage to the GND terminal 17, the current to voltage characteristic of the drain with respect to the source of the N-channel transistors is such as illustrated in FIG. 18. Further, a route along which the current flows in FIG. 18 is shown in FIG. 19. In FIG. 18, if the drain voltage becomes equal to a breakdown voltage VB of the transistors by a surge, then breakdown occurs at locations immediately below end portions of the gates adjacent the drains. Thereafter, current flows from the drain regions toward the P well along a current route A of FIG. 19, and when a point given by V1, I1 is reached, the PN junctions between the P well and the source regions are turned on. Consequently, current flows along the drain region→P well→source region of a current route B of FIG. 19, and the voltage snaps back to a snap-back voltage VS. After the snap-back, the voltage and the current increase with an inclination defined by a sum total of a resistance of a metal wire between the input/output terminal 18 and the drain regions (N$^+$-type diffused layer 3B), a diffused layer resistance of the drain regions (N$^+$-type diffused layer 3B), a P well resistance between the drain regions (N$^+$-type diffused layer 3B) and the source regions (N$^+$-type diffused layer 3A), a diffused layer resistance of the regions (N$^+$-type diffused layer 3A) and a resistance of a wire between the source regions (N$^+$-type diffused layer 3A) and the GND terminal 17. V2 and I2 represent a voltage and a current, respectively, at which the transistors are broken down by heat generation when the voltage and the current increase.

Of the resistances which contribute to the increases of the voltage and the current after the snap-back mentioned above, the metal wire resistances are as low as several $\Omega$, and also the P well resistance between the drain regions (N$^+$-type diffused layer 3B) and the source regions (N$^+$-type diffused layer 3A) when the bipolar transistors are turned on is approximately several $\Omega$ per 100 $\mu$m of the gate width. The diffused layer resistances of the drain regions (N$^+$-type diffused layer 3B) and the source regions (N$^+$-type diffused layer 3A) are as high as several hundreds $\Omega$ absent the surface titanium silicide layer, but as a result of conversion into titanium silicide, also they are as low as approximately several $\Omega$. Accordingly, since the total resistance is approximately several tens $\Omega$, the voltage increase until the transistor is broken down after the snap-back is small, and as a result, the relationship of VS<V2<VB<V1 is obtained. According to an example of actual evaluation, V2 of the transistor wherein VB was 15 V, VI was 15.5 V and VS was 10 V was 12 V.

Here, a first problem arises from the relationship of V2<VB. In particular, if only one of a plurality of divisional transistors shown in FIG. 16 breaks down due to an offset in timing at which a surge flows, then the drain voltage increases only to V2 in the maximum after it snaps back to VS of the transistor, and consequently, the drain voltages of the remaining transistors do not reach the breakdown voltage and no breakdown occurs with the remaining transistors. As a result, since the surge flows only through the single transistor which has broken down first, if the surge exceeds the electrostatic breakdown withstanding voltage of the single transistor, breakdown by remarkable heat generation occurs and the input/output protection circuit loses its function.

The second problem resides in that the life of the transistor is deteriorated by hot carriers produced by the current I1. This is a phenomenon that breakdown of a transistor occurs at a location immediately below an end portion of the gate adjacent the drain region (N$^+$-type diffused layer 3B) and, when the current which thereafter flows passes by the gate insulating film, hot carriers are produced and caught by the gate insulating film, thereby causing a drop of the current of the transistor and further causing dielectric breakdown of the gate insulating film. This phenomenon arises from the current while the voltage increases from VB to V1, and when the voltage is V1, the current is in the maximum at I1.

While the foregoing description is given taking notice of the N-channel transistors, also with the P-channel transistors, problems similar to the first and second problems described above are caused by a similar phenomenon.

SUMMARY OF THE INVENTION

It is an object of the present invention to provide an input/output protection circuit which exhibits a high protection function also for a semiconductor device which includes refined MOS transistors and has a diffused layer made of metal silicide.

In order to attain the object described above, according to the present invention, there is provided a semiconductor device, comprising a plurality of circuit elements formed on a semiconductor substrate, a field oxide film selectively provided on the semiconductor substrate for electrically isolating the circuit elements from one another, an input terminal for supplying an external signal to a first one of the circuit elements, an output terminal for supplying a signal from a second one of the circuit elements to the outside, and a pair of protection elements interposed between the first circuit element and the input terminal and between the second circuit element and the output terminal for protecting the circuit elements from an external surge, each of the protection elements including a plurality of MOS transistors arranged in parallel and each including a source region which includes a first diffused layer of a second conduction type selectively formed on a surface of a region of a first conduction type of a surface portion of the semiconductor substrate and a first metal silicide layer formed on a surface of the first diffused layer of the second conduction type, a source electrode connected to the first metal silicide layer, a drain region including a second diffused layer of the second conduction time provided in an opposing relationship to and extending deeper than the first diffused layer of the second conduction type at least on a surface portion of the region of the first conduction type, a third diffused layer of the second conduction type formed on a surface portion of the second diffused layer of the second conduction type and containing an impurity in a concentration higher than that of the surface portion of the second diffused layer of the second conduction type and a second metal silicide layer provided on a surface of the third diffused layer of the second conduction type, a drain electrode connected to the second metal silicide layer, an insulation region formed between the first diffused layer of the second conduction type and the third diffused layer of the second conduction type and extending from the surface of the second diffused layer of the second conduction type to a predetermined depth, and a gate electrode covering over the surface of the semiconductor substrate between the first diffused layer of the second conduction type and the insulation region with a gate insulating film interposed therebetween.

The semiconductor device may be constructed such that each of the MOS transistors which form the protection elements is connected at the gate electrode and the source electrode thereof to a same power supply terminal, and a parasitic resistance along a current route from the drain electrode to the first diffused layer of the second conduction type when an excessively high voltage is applied to the drain electrode is increased by provision of the second diffused layer of the second conduction type so that a thermal breakdown voltage thereof is set higher than a withstanding voltage of the drain electrode. In this instance, preferably the semiconductor device further comprises a resistance element connected at an end thereof to the drain electrode of each of the MOS transistors which form the protection elements, and a clamping diode element interposed between the other end of the resistance element and the source electrode of the MOS transistor and having a withstanding voltage lower than a breakdown voltage of the MOS transistor.

Else, the semiconductor device may be constructed such that channel lengths of the MOS transistors which form the protection elements are set shorter than three times the smallest channel length of MOS transistors which form the circuit elements.

Otherwise, the semiconductor device may further comprise a fourth diffused layer of the second conduction provided in contact with at least a bottom face of the first diffused layer of the second conduction type and having a concentration lower than that of the first diffused layer of the second conduction type. In this instance, the semiconductor device may be constructed such that the fourth diffused layer of the second conductor type surrounds the first diffused layer of the second conduction type. Preferably, the fourth diffused layer of the second conduction type is formed simultaneously with a well of the second conduction type.

Preferably, the second diffused layer of the second conduction type is formed simultaneously with a well of the second conductor type.

With the semiconductor device, since the third diffused layer of the second conduction type which has a resistance reduced by the second metal silicide layer is provided on the surface portion of the second diffused layer of the second conduction type and the insulation region is provided on the surface portion of the second diffused layer of the second conduction type, the resistance along a current route when any of the protection elements breaks down can be increased, and consequently, thermal breakdown of the circuit elements occurs less likely.

Thus, according to the present invention, even if a plurality of MOS transistors each of which has a diffused layer, which has a reduced resistance since it is formed from metal silicide, at source and drain regions are connected in parallel to form an input/output protection device, a semiconductor device which includes such input/output protection devices can prevent such a situation that, if any of the MOS transistors suffers from thermal breakdown by an external surge applied to an input/output terminal, the remaining MOS transistors do not effectively function any more. Consequently, the reliability of the semiconductor device of a refined construction which operates at a high speed can be assured. The reason is that, since the second diffused layer of the second conduction type of a low concentration is added as the drain regions of the MOS transistors and the insulation region is provided between the drain electrodes and the gate electrodes, the parasitic resistance along the route of current to flow from the drain electrodes to the source regions is increased so that the electrostatic breakdown voltage of the MOS transistors can be made higher than the breakdown voltage of the MOS transistors.

Further, the semiconductor device which includes the input/output protection circuits according to the present invention can be produced without increasing production steps for conventional semiconductor devices.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 11(a) and 11(b), 12(a) and 12(b), and 13(a) and 13(b) are sectional views showing an N-channel transistor section and a P-channel transistor section, respectively, and illustrating successive steps of a method of producing the input/output protection circuit shown in FIG. 9;

DESCRIPTION OF THE PREFERRED EMBODIMENTS

Figure 1:
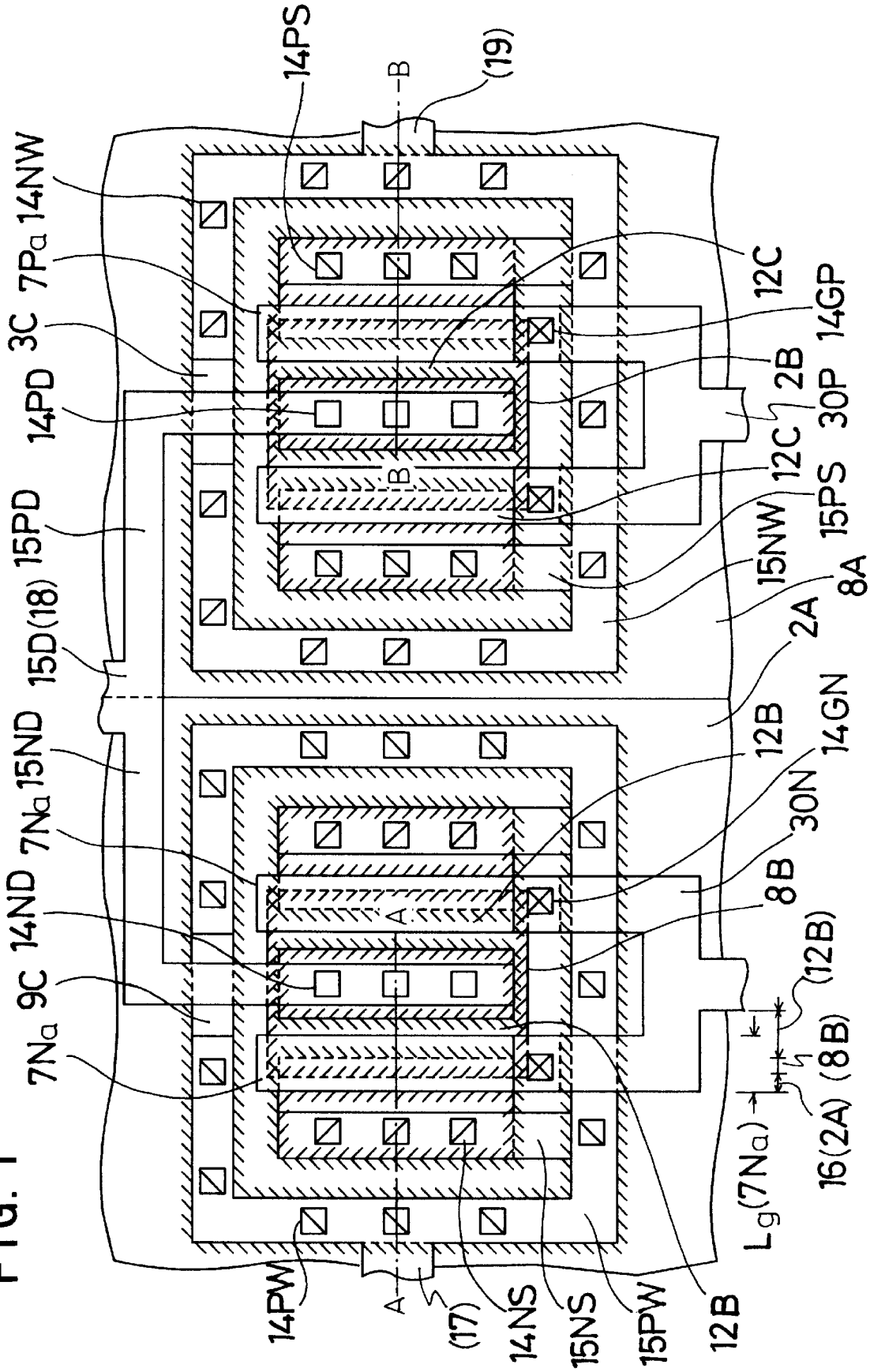
FIG. 1 is a plan view of a semiconductor device including an input/output protection circuit showing a first preferred embodiment of the present invention.
Figure 2:
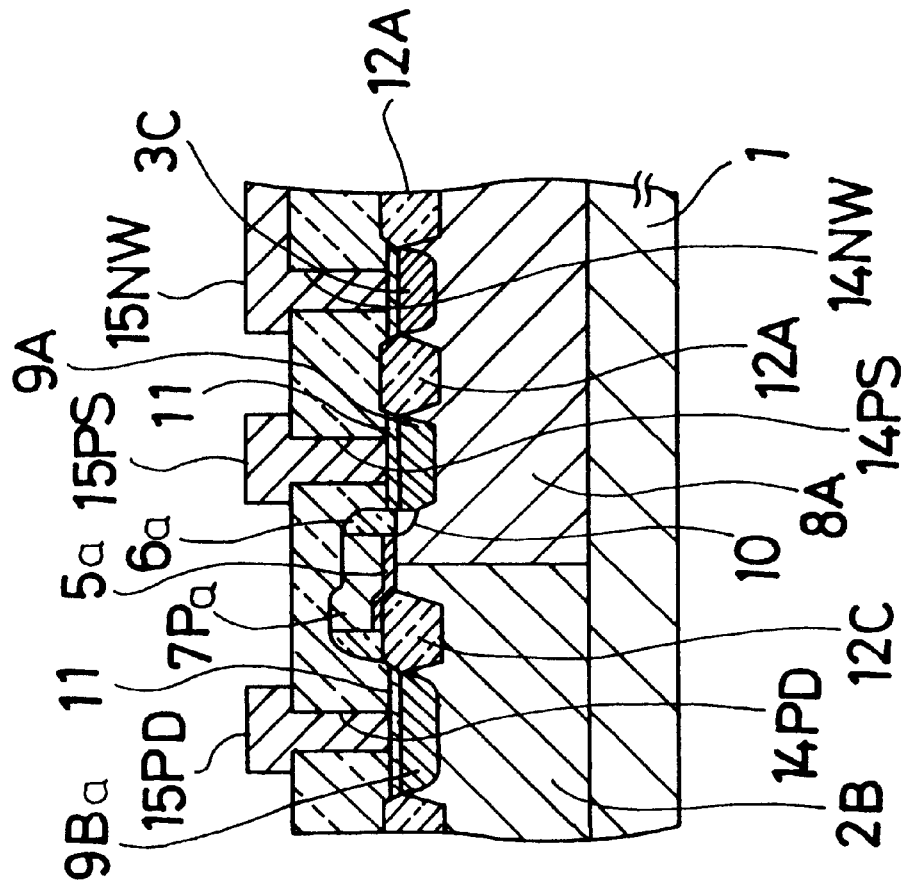
FIGS. 2(a) and 2(b) are sectional views taken along lines A—A and B—B of FIG. 1, respectively.
Figure 2:
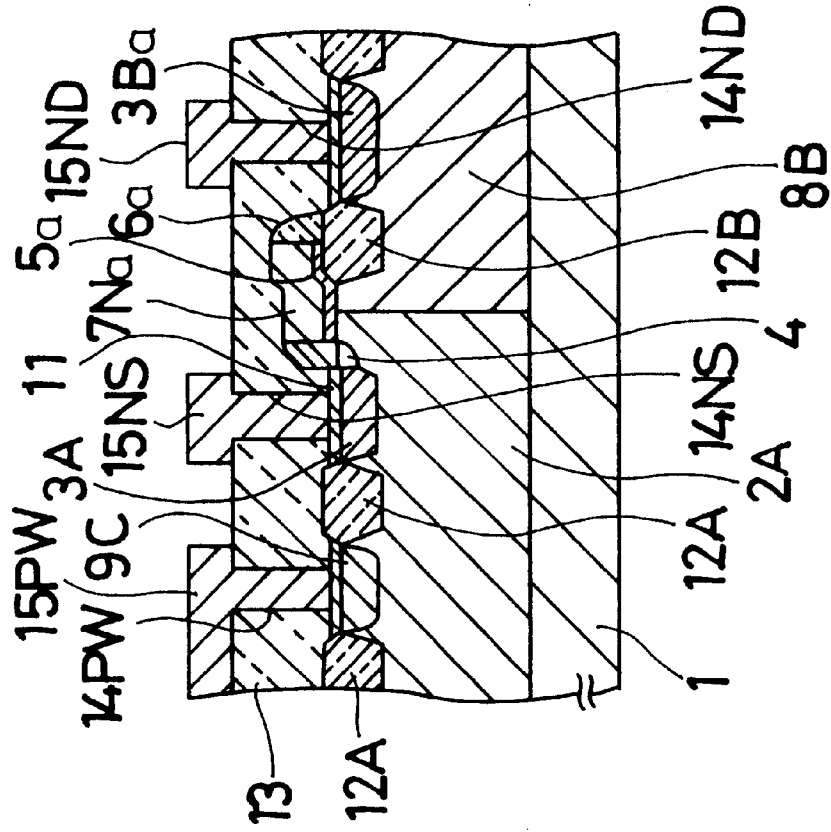
Figure 16:
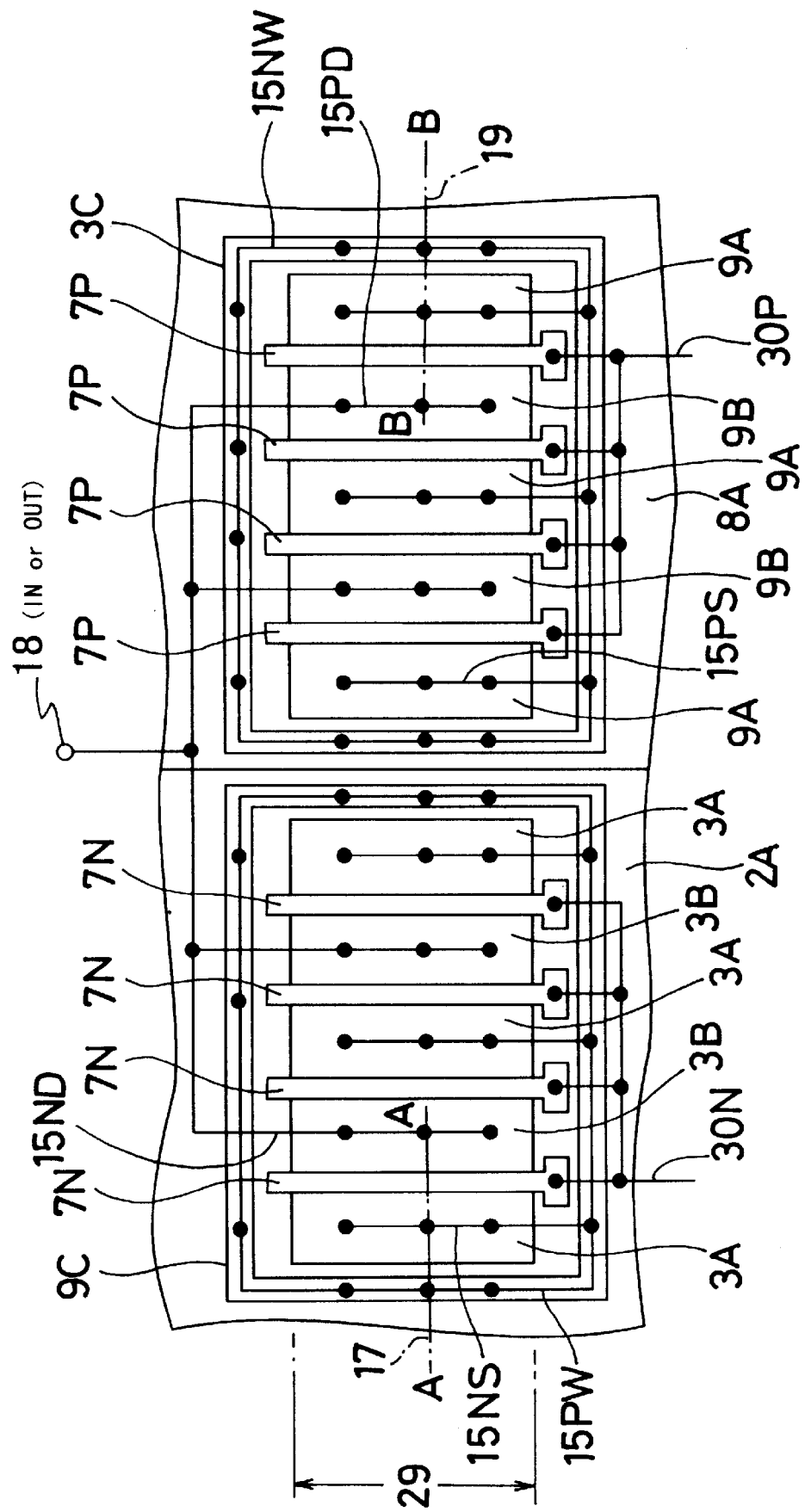
FIG. 16 is a schematic plan view showing a layout of the input and output protection circuits shown in FIGS. 15(a) and 15(b), respectively.
Figure 17A:
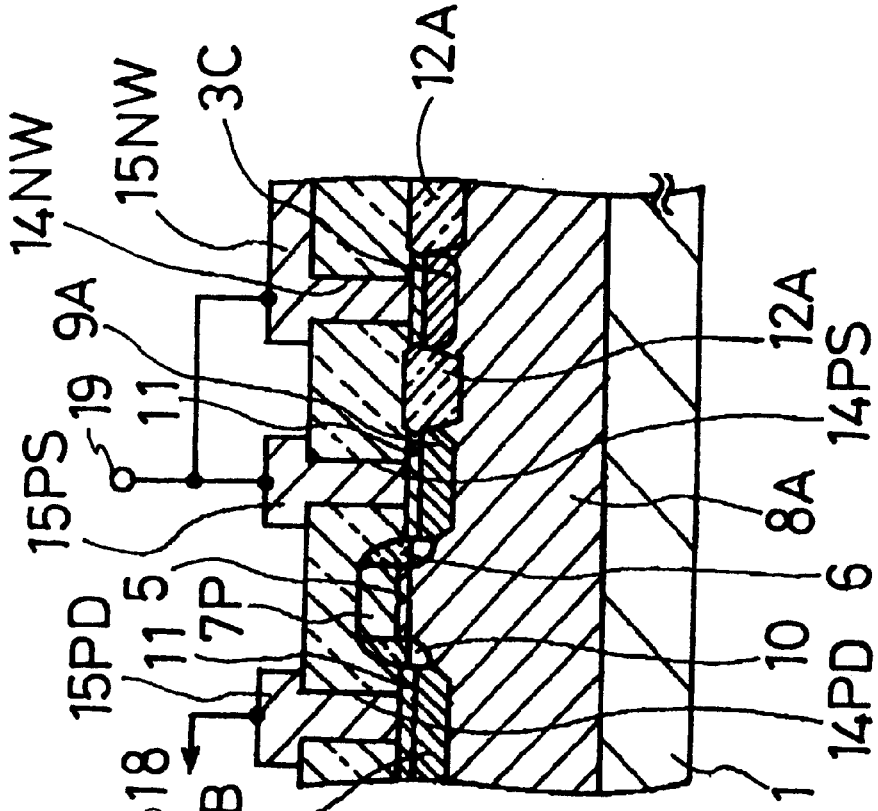
FIGS. 17(a) and 17(b) are schematic sectional views taken along lines A—A and B—B of FIG. 16, respectively.
Figure 17B:
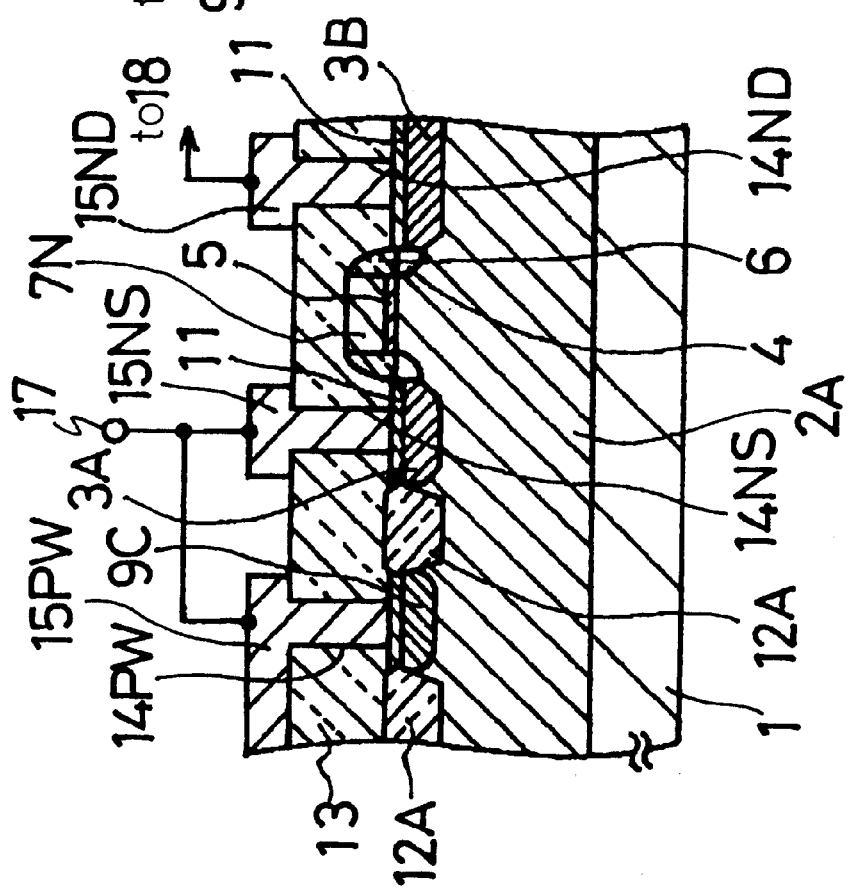

Referring first to FIGS. 1, 2(a) and 2(b), there is shown an input/output protection circuit of a semiconductor device to which the present invention is applied. It is to be noted that, while two transistors are shown arranged in parallel in FIG. 1, actually four or more transistors are arranged in parallel similarly as in FIG. 16.

Figure 15:
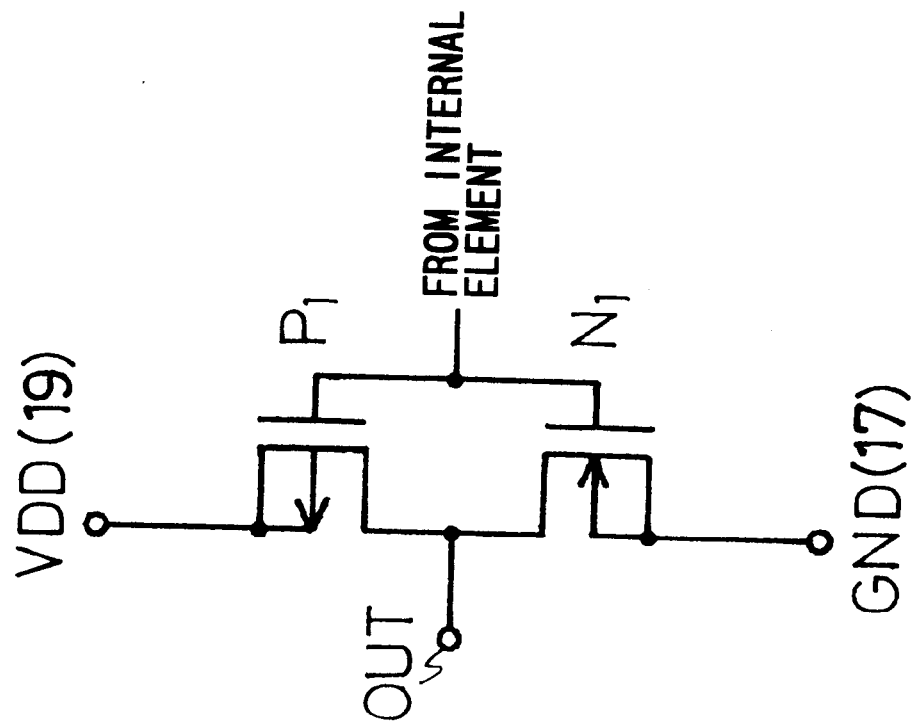
FIGS. 15(a) and 15(b) are circuit diagrams showing an input protection circuit and an output protection circuit.
Figure 15:
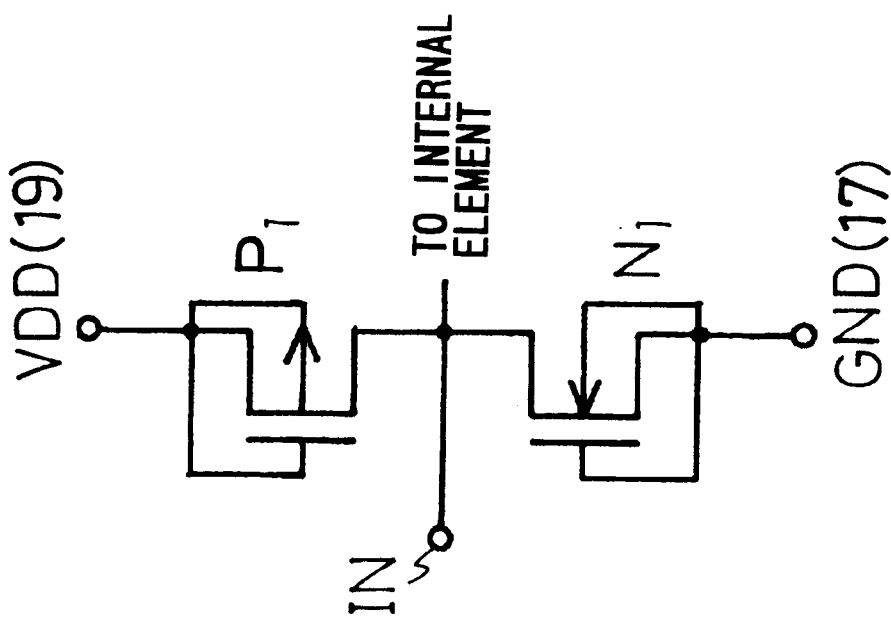

In particular, FIGS. 1, 2(a) and 2(b) show a protection element of a semiconductor device which includes a plurality of circuit elements (not shown) formed on a P-type silicon semiconductor substrate 1, a field oxide film 12A selectively provided on the P-type silicon semiconductor substrate 1 for electrically isolating the circuit elements from one another, an input terminal for supplying an output terminal to a first one of the circuit elements, an output terminal for supplying a signal from a second one of the circuit elements to the outside, and two such protection elements interposed between the first circuit element and the input terminal and between the second circuit element and the output terminal for protecting the circuit elements from an external surge. An input/output protection circuit formed from the protection element shown in FIGS. 1, 2(a) and 2(b) is shown in FIGS. 15(a) and 15(b) similarly to the conventional input/output protection circuit described hereinabove.

The protection element is composed of an N-channel transistor section and a P-channel transistor section. The P-channel transistor section includes a plurality of MOS transistors (P-channel transistors) arranged in parallel to each other and each including a source region which includes a first P-type diffused layer (P$^+$-type diffused layer 9A and P$^-$-type diffused layer 10) selectively formed on a surface portion of an N-type region (N well 8A) on a surface portion of the P-type silicon semiconductor substrate 1 and a first metal silicide layer (titanium silicide layer 11) formed in a self-aligned relationship with and on a surface of the P$^+$-type diffused layer 9A, a source electrode (metal electrode 15PS) connected to the first metal silicide layer, a drain region which includes a second P-type diffused layer (P well 2B) provided at a substantially same depth as the N well 8A in an opposing relationship to but deeper than the first P-type diffused layer (9A, 10), a third P-type diffused layer (P$^+$-type diffused layer 9Ba) formed on a surface portion of the P well 2B and containing an impurity in a higher concentration than that of the P well 2B and a second metal silicide layer (titanium silicide layer 11) provided in a self-aligned relationship with and on a surface of the P$^+$-type diffused layer 9Ba, a drain electrode (metal electrode 15PD) connected to the second metal silicide layer, an insulation region 12C provided between the first P-type diffused layer (9A, 10) and the P$^+$-type diffused layer 9Ba and extending to a predetermined depth from the surface of the P well 2B, and a gate electrode 7Pa covering over the surface of the P-type silicon semiconductor substrate 1 between the first P-type diffused layer (9A, 10) and the insulation region 12C with a gate insulating film 5a (silicon oxide film of 10 nm thick) interposed therebetween.

It is to be noted that, in FIG. 1, side wall spacers 6a are not shown for the convenience of illustration, and the N$^-$-type diffused layer 4 and the P$^-$-type diffused layer 10 are shown as an N$^-$-type diffused layer and a P-type diffused layer combined with the N$^+$-type diffused layer 3A and the P$^+$-type diffused layer 9A, respectively.

Meanwhile, the N-channel transistor section includes a plurality of MOS transistors (N-channel transistors) arranged in parallel to each other and each including a source region including a first N-type diffused layer (N$^+$-type diffused layer 3A and N$^-$-type diffused layer 4) selectively formed on a surface portion of a P-type region (P well 2A) of a surface portion of the P-type silicon semiconductor substrate 1 and a first metal silicide layer (titanium silicide layer 11) formed on the surface of the N$^+$-type diffused layer 3A, a source electrode (metal electrode 15NS) connected to the first metal silicide layer, a drain region which includes a second N-type diffused layer (N well 8B) provided at a substantially same depth as the P well 2A in an opposing relationship to but deeper than the first N-type diffused layer (3A, 4), a third N-type diffused layer (N$^+$-type diffused layer 3Ba) formed on a surface portion of the N well 8B and containing an impurity with a higher concentration than that of the N well 8B and a second metal silicide layer (titanium silicide layer 11) provided on the surface of the N$^+$-type diffused layer 3Ba, a drain electrode (metal electrode 15ND) connected to the second metal silicide layer, an insulation region 12B provided between the first N-type diffused layer (3A, 4) and the N$^+$-type diffused layer 3Ba and extending to a predetermined depth from the surface of the N well 8B, and a gate electrode 7Na covering over the surface of the P-type silicon semiconductor substrate 1 between the first N-type diffused layer (3A, 4) and the insulation region 12B with the gate insulating film 5a interposed therebetween. The metal electrodes 15NS, 15ND, 15NW, 15PS, 15PD and 15PW are connected to the diffused layers 3A, 3Ba, 3C, 9A, 9Ba and 9C through contact holes 14NS, 14ND, 14NW, 14PS, 14PD and 14PW formed in the inter-layer insulating film 13, respectively.

Similarly, the gate electrodes 7Na and 7Pa are connected to metal wires 30N and 30P of the second layer which selectively covers over the inter-layer insulating film not shown, through contact holes 14GN and 14GP, respectively. The N$^+$-type diffused layer 3A of the source regions of the N-channel transistors are individually connected to the metal electrodes 15NS, connected to the metal electrodes 15PW connected to the P⁺ diffused layer 9C which is a contact region of the P well 2A and further connected to the GND terminal 17. The N⁺-type diffused layer 3Ba of the drain regions of the N-channel transistors are connected similarly to the metal electrodes 15ND and connected to one of an input terminal IN (refer to FIG. 15(a)) and an output terminal OUT (refer to FIG. 15(b)). The gate electrodes 7Na of the N-channel transistors are connected commonly by the metal wires 30N and connected to one of the GND terminal 17 (refer to FIG. 15(a)) or an internal element not shown (refer to FIG. 15(b)).

The P⁺-type diffused layer 9A of the source regions of the P-channel transistors is individually connected to the metal electrodes 15PS, connected to the metal electrodes 15NW connected to the N⁺ diffused layer 3C which is a contact region of the N well 8A, and further connected to the VDD terminal 19. The P⁺-type diffused layer 9B of the drain regions of the P-channel transistors is connected similarly to the metal electrodes 15PD and connected to one of the input terminal IN (FIG. 15(a)) and the output terminal OUT (FIG. 15(b)). The gate electrodes 7P of the P-channel transistors are connected commonly by the metal wires 30P and connected to one of the VDD terminal 19 (FIG. 15(a)) and another internal element (FIG. 15(b)) not shown.

The input/output protection circuit in the present embodiment is characterized in that the insulation regions 12B and 12C which are formed simultaneously with the field oxide film 12A of 500 nm thick are provided between the N⁺-type diffused layer 3Ba of the drain regions and the gate electrodes 7Na of the N-channel transistors and between the P⁺-type diffused layer 9Ba of the drain regions and the gate electrodes 7Pa of the P-channel transistors, respectively, and the gate electrodes 7Na and 7Pa partially extend to locations above the insulation regions 12B and 12C, respectively. Here, the channel regions of the transistors are the P well 2A and the N well 8A positioned below the gate electrodes 7Na and 7Pa except portions which extend above the insulation regions 12B and 12C, respectively, and the lengths of the channel regions are channel lengths (in FIG. 1, a channel length 16 of the N-channel transistors is indicated). The reason why the gate electrodes 7Na and 7Pa partially extend above the insulation regions 12B and 12C is that it is intended to prevent the gate electrodes and the insulating regions from being displaced from each other by positional displacement upon production. Further, the N well 8B is formed below the N⁺-type diffused layer 3Ba and the insulation region 12B and besides is formed so as to extend to the channel regions so that the N-channel transistors may be prevented from becoming offset. Similarly, the P well 2B is expanded to locations below the P⁺-type diffused layer 9Ba and the insulation region 12C and to the channel regions so that the P-channel transistors may be prevented from becoming offset.

Subsequently, operation of the input/output protection circuit in the present embodiment when an external surge is applied to it is described. First, when a surge is applied as a negative voltage with respect to the GND terminal 17 to the input/output terminal 18 (connected to the metal line 15D), since this makes a forward voltage to the PN junction between the N⁺-type diffused layer 3Ba and the P well 2A, the forward PN junction is turned on. Then, the surge flows from the GND terminal 17 to the input/output terminal 18 through the P⁺ diffused layer 9C, P well 2A, N well 8B and N⁺-type diffused layer 3Ba.

Figure 3:
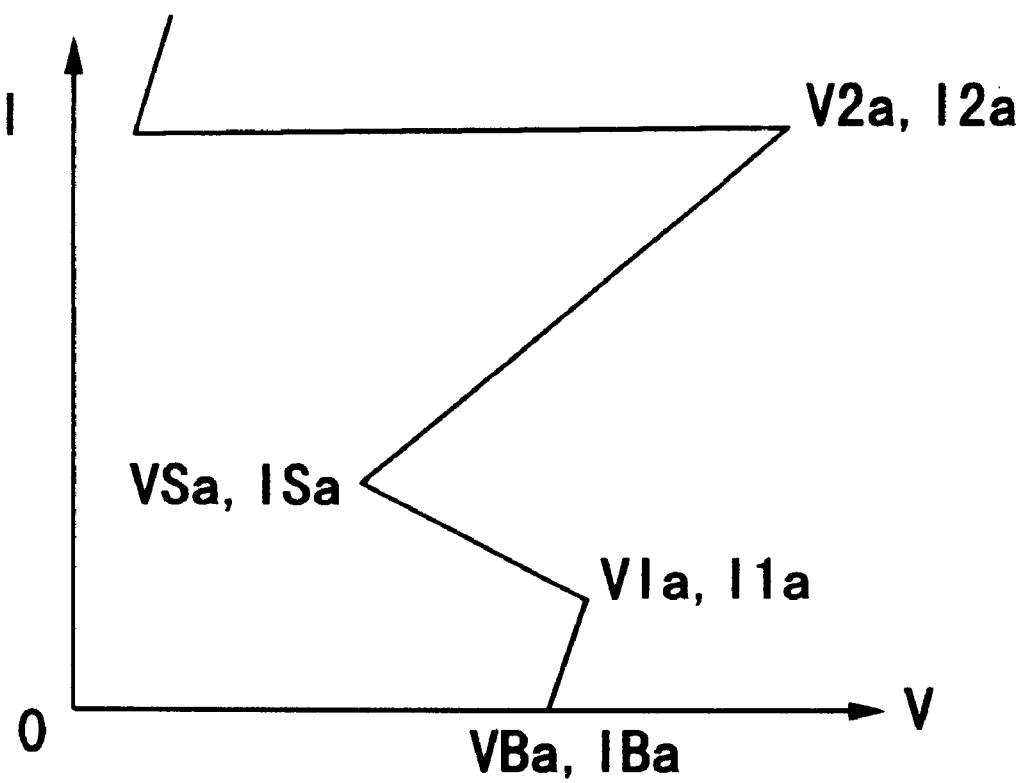
FIG. 3 is a diagram illustrating a current-voltage characteristic of transistors shown in FIG. 1.
Figure 18:
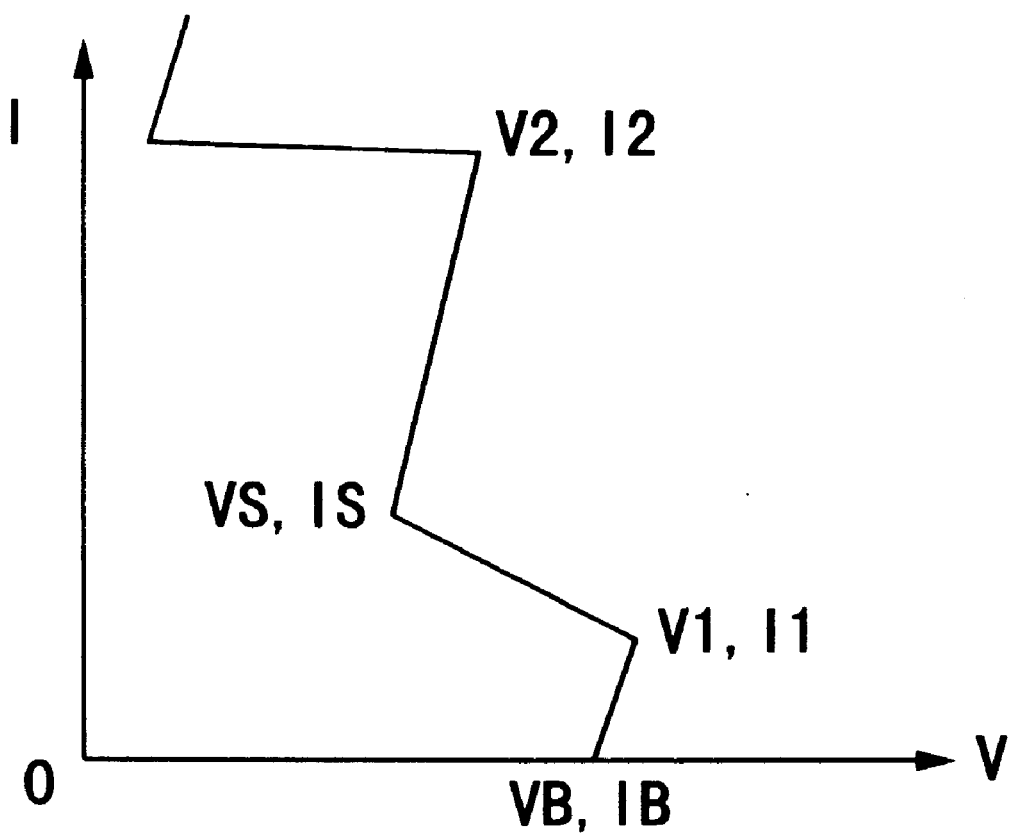
FIG. 18 is a diagram illustrating a current-voltage characteristic of transistors shown in FIG. 16.
Figure 19:
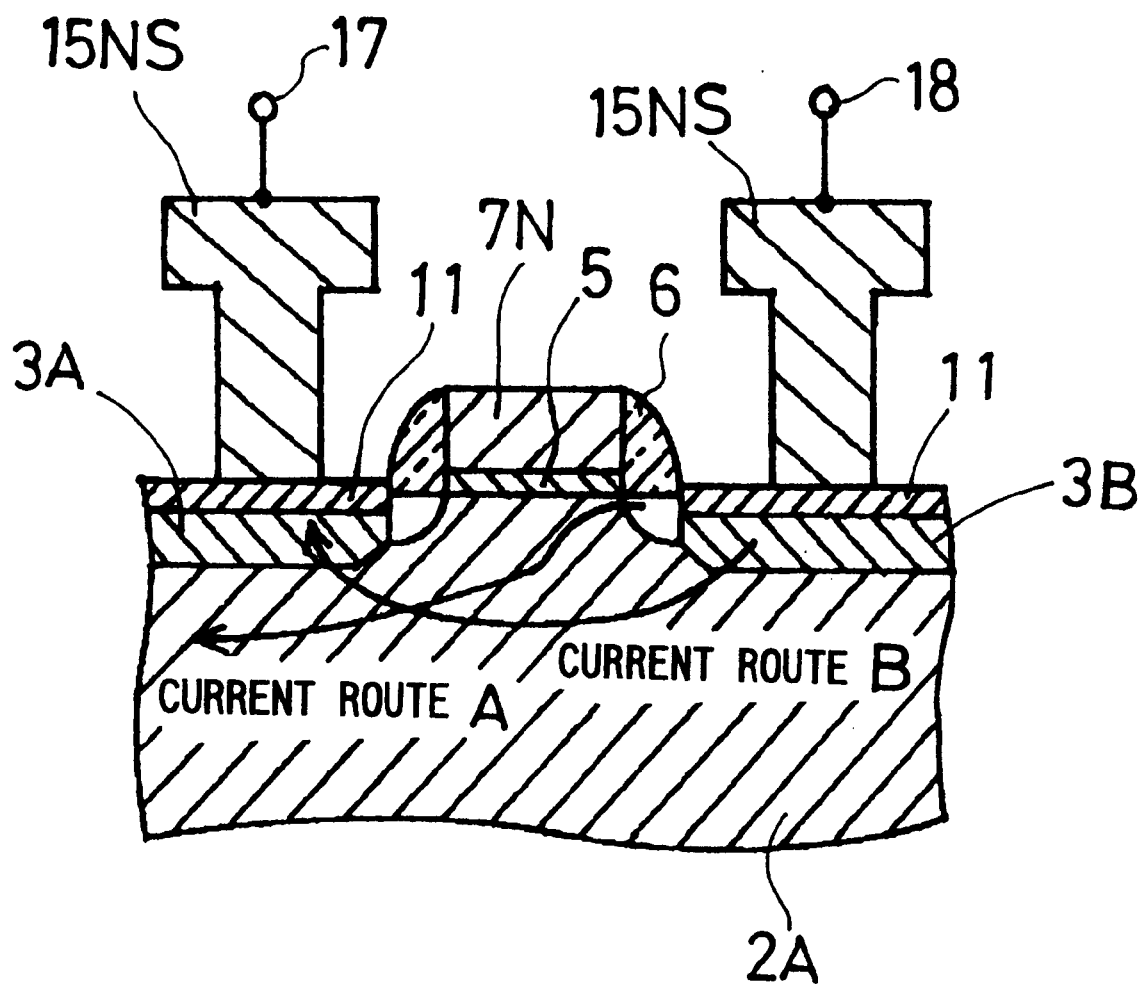
FIG. 19 is a schematic sectional view illustrating a route of current when a transistor shown in FIG. 16 breaks down.

Then, if a surge is applied as a positive voltage to the GND terminal 17, the N-channel transistors operate. Operation of each of the N-channel transistors is described below with reference to FIG. 3 which illustrates a current-voltage characteristic of the drain to the source and FIG. 4 which illustrates a route of current. When the drain voltage is increased by the surge, the voltages at the N⁺-type diffused layer 3Ba and the N well 8B increase, and when the drain voltage becomes equal to VBa, breakdown occurs at the PN junction between the P well 2A and the N well 8B immediately below the gate electrode 7Na due to a potential difference between the N well 8B and the gate electrode 7Na, and consequently, current flows from the drain region (3Ba) to the P well 2A along a current route A1 illustrated in FIG. 4. Thereafter, when a point defined by V1a, I1a of FIG. 3 is reached, the PN junctions between the P well 2A and the source regions (N⁺-type diffused layer 3A) are turned on, and consequently, current flows along another current route B1 of the drain region (3Ba)→N well 8B→P well 2A→source region (3A) of FIG. 4 and the voltage snap backs to a snap-back voltage VSa. After the snap-back, the voltage and the current increase with an inclination defined by a total resistance of the current route from the input/output terminal 18 to the GND terminal 17. In this instance, since an N well resistance 20 below the insulation region 12B in the current route has a high resistance of several hundreds Ω, also the increase of the voltage as the current increases is great, and as a result, the voltage V2a at which the transistor is destroyed becomes V2a>VBa as seen from FIG. 3. According to an example of actual evaluation, V2a was 23 V with a transistor where VBa was 18 V, V1a was 19 V and VSa was 14 V. In this instance, the channel length 16 was 0.8 μm (same as in the conventional input/output protection circuit of FIGS. 16 and 18), the gate electrode length Lg (width of the gate electrode 7Na) was 1.6 μm, the width of the insulation region 12B was 0.6 μm, and the distance between the P well 2A and the insulation region 12B was 0.6 μm.

Accordingly, even if only one of the divisional transistors first breaks down due to a displacement among timings at which a surge flows through the divisional transistors, the drain voltage increases to VBa before it reaches V2a after it snaps back to VSa of the transistor. According to the design, also the remaining transistors successively suffer from breakdown. As a result, since the surge flows as on-current through all of the transistors, the electrostatic breakdown voltage of the transistors is not exceeded and the input/output protection circuit can maintain its function.

Where a plurality of transistors are connected in parallel to construct an input/output protection circuit, in order to allow all transistors to exhibit a protection function, the highest value of breakdown voltages of the transistors should be lower than the lowest value of thermal breakdown voltages of the transistors. While the Joule heat Q by a surge is given by the product $RI^2$ of the resistance R along the current route and the square of the current I, in the condition that RI is constant, Q increases in inverse proportion to R. Roughly speaking, as R increases, the thermal breakdown voltage increases. When compared with a conventional input/output protection circuit, since the current route B1 is longer than the current route B and goes around long, also the Joule heat is generated in a spatially dispersed condition, and this is effective to raise the thermal breakdown voltage together with the fact that the resistance R is high. Accordingly, the condition mentioned hereinabove can be realized readily.

It is to be noted that the channel length 16 of protection transistors is preferably set shorter than three times the smallest channel length of internal circuit elements (MOS transistors). Although a protection transistor having a channel length three times long is sometimes employed as a high voltage withstanding element in an internal circuit, it is not preferable to use a high voltage withstanding element as a protection element. Further speaking, firstly, as the channel length decreases, the element size decreases and the area of the entire protection element can be reduced. Secondly, since the snap-back voltage VS decreases as the channel length decreases, also the voltage applied to internal elements while a surge is discharged decreases, and breakdown of a gate insulating films of the internal elements by a high voltage can be suppressed. Thirdly, as the channel length decreases, the driving capacity of the protection transistors when the input/output protection circuit serves also as an input/output buffer (the circuit of FIG. 15(b) serves also as an output buffer), that is, the on-current when a power supply voltage is applied to the drain and the gate, can be increased.

When a surge is applied as a positive voltage with respect to the VDD terminal 19 to the input/output terminal 18, since this makes a forward voltage to the PN junction between the $P^+$-type diffused layer 9Ba and the N well 8A, the forward PN junction is turned on. Thereafter, the surge flows from the input/output terminal 18 to the VDD terminal 19 through the $P^+$-type diffused layer 9Ba, P well 2B, N well 8A and $N^+$ diffused layer 3C. However, when a surge is applied as a negative voltage to the VDD terminal 19, the P-channel transistors operate. Since similar effects to those described above can be obtained from the P-channel transistors by reversing the currents and the voltages of the N-channel transistors between the positive and the negative, description of them is omitted here.

Figure 5:
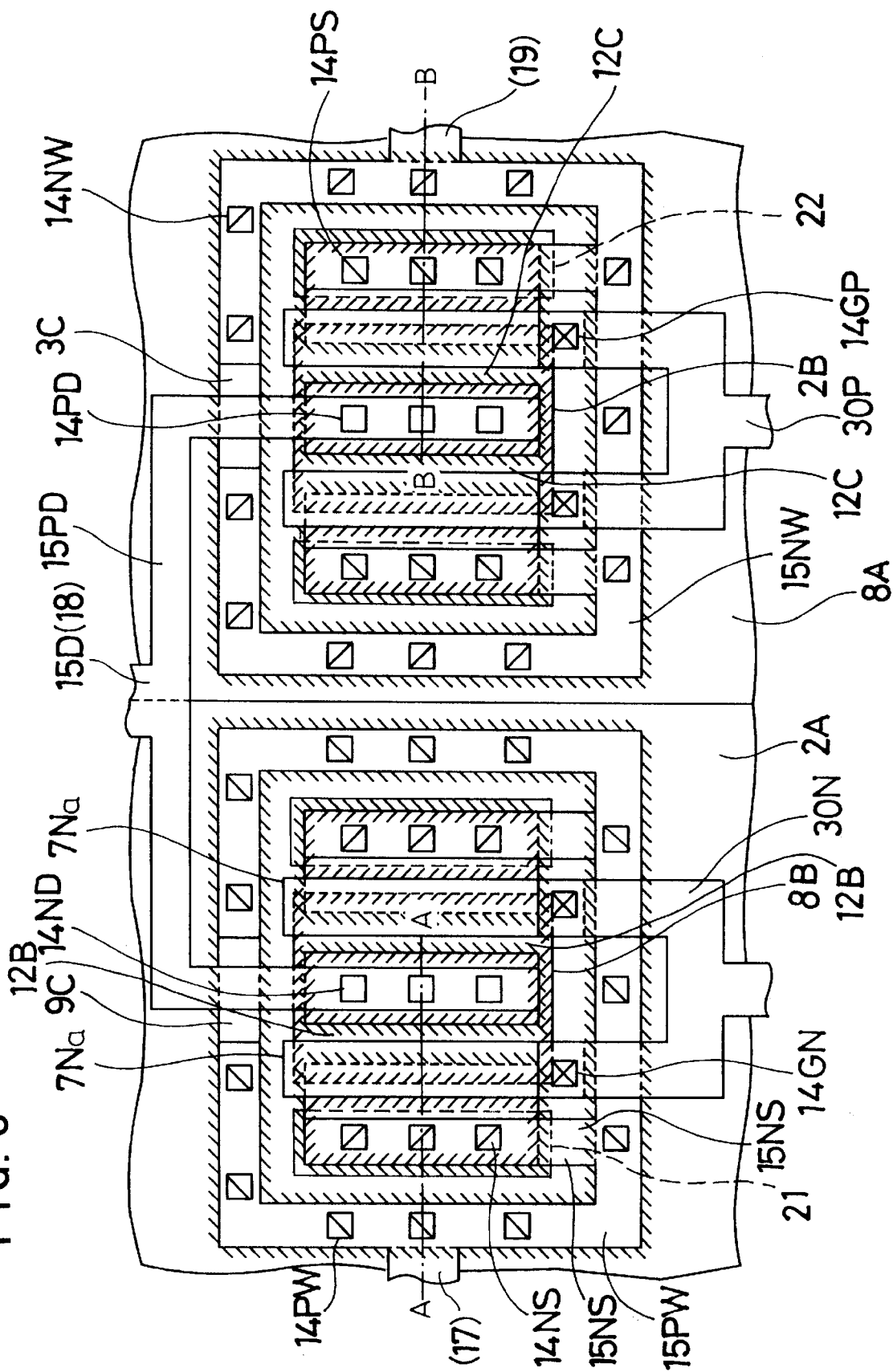
FIG. 5 is a plan view of another semiconductor device including an input/output protection circuit showing a second preferred embodiment of the present invention.
Figure 6B:
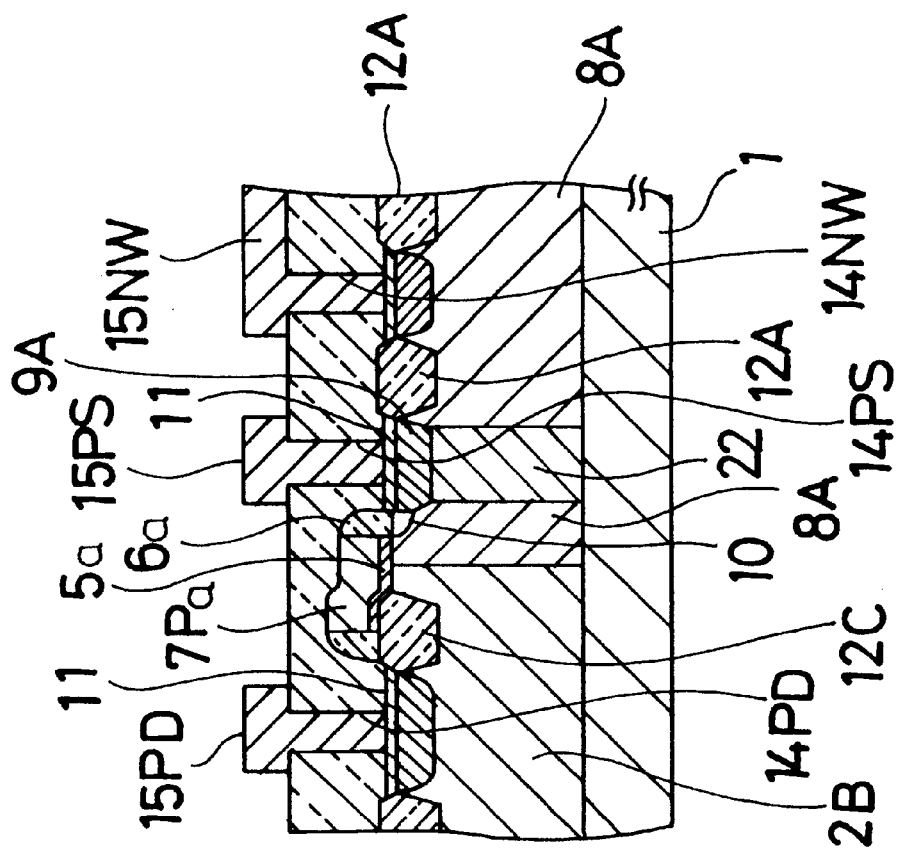
FIGS. 6(a) and 6(b) are sectional views taken along lines A—A and B—B of FIG. 5, respectively.
Figure 6A:
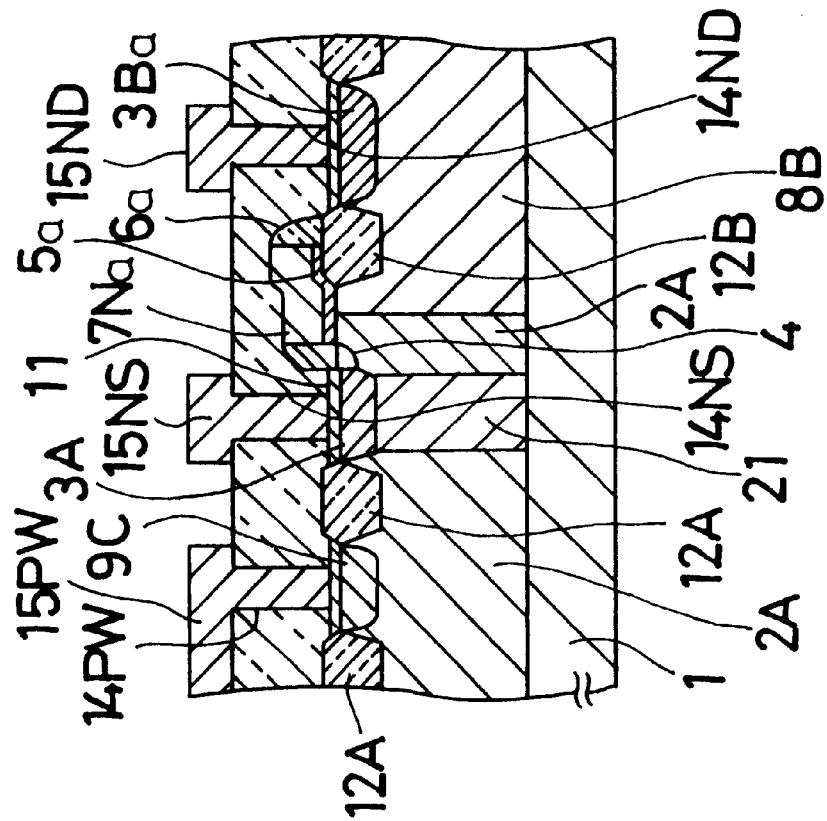

Referring now to FIGS. 5, 6(a) and 6(b), there is shown another input/output protection circuit of another semiconductor device to which the present invention is applied. The input/output protection circuit in the present embodiment is a modification to and is different from the input/output protection circuit in the first embodiment in that an $N^-$-type diffused layer 21 is formed below and in contact with the $N^+$-type diffused layer 3A which provides source regions of the N-channel transistors and a $P^-$-type diffused layer 22 is formed below and in contact with the $P^+$-type diffused layer 9A which provides source regions of the P-channel transistors.

Figure 7:
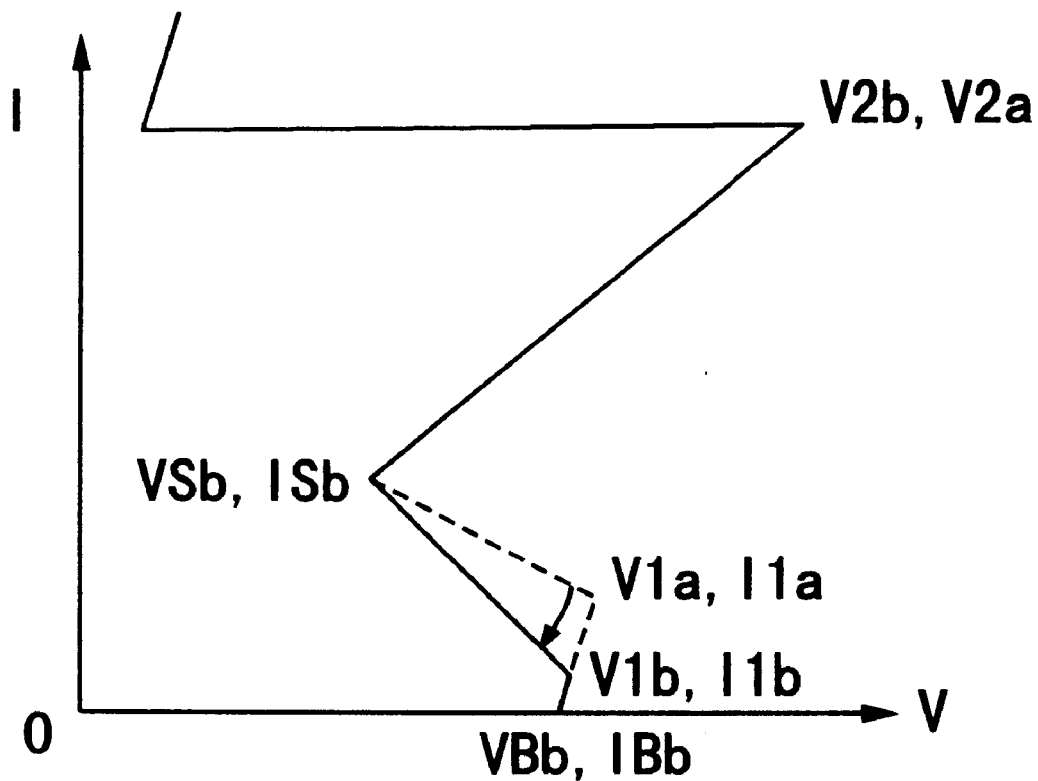
FIG. 7 is a diagram illustrating a current-voltage characteristic of transistors shown in FIG. 5.
Figure 8:
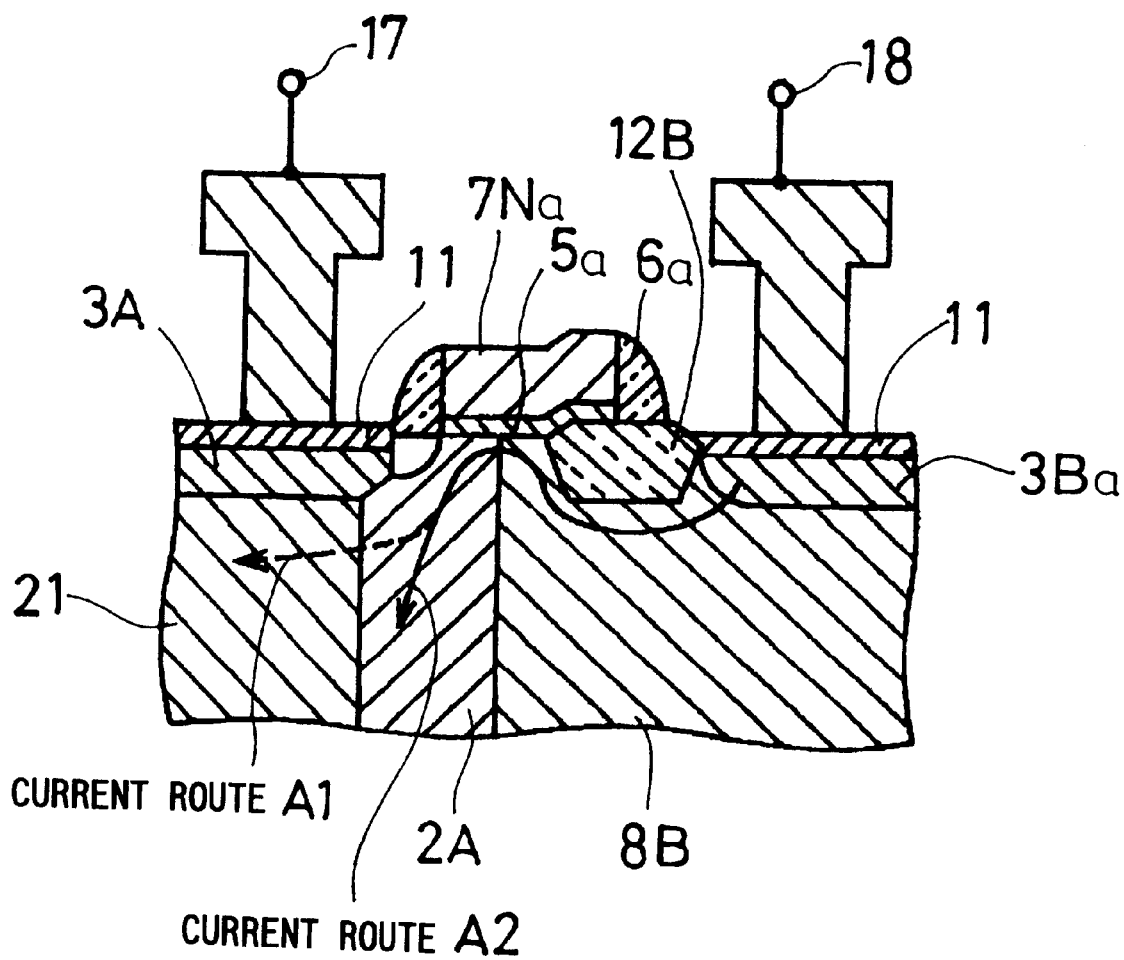
FIG. 8 is a sectional view illustrating a route of current when breakdown of a transistor shown in FIG. 5 occurs.

Operation of the input/output protection circuit in the present embodiment when an external surge is applied as a negative voltage to the GND terminal 17 is same as that of the input/output protection circuit in the first embodiment described above. However, when a surge is applied as a positive voltage to the GND terminal 17, the N-channel transistors operate. Operation of each of the N-channel transistors is described with reference to FIG. 7 which illustrates a current to voltage characteristic of the drain to the source and FIG. 8 which illustrates a route of current. When the drain voltage is increased to VBb by the surge, breakdown occurs at the PN junction between the P well 2A and the N well 8B immediately below the gate electrode 7Na and current flows from the drain region (3Ba) to the P well 2A. In this instance, however, as seen from a current route A2 illustrated in FIG. 8, the current flows bypassing the $N^-$-type diffused layer 21, and consequently, the current route is dispersed to a deeper region than that of the current route A1 where the $N^-$-type diffused layer 21 is absent. If the P-type impurity concentration is such that it decreases in a deep region in the P well 2A, then the voltage drop when the current flows along the current route A2 becomes greater than that when the current flows along the current route A1, and the forward voltage applied between the P well 2A and the $N^+$-type diffused layer 3Ba or between the P well 2A and the $N^-$-type diffused layer 21 increases. Further, since the impurity concentration of the $N^-$-type diffused layer 21 is lower than that of the $N^+$-type diffused layer 3Ba, the forward voltage at which the PN junction is turned on is lower between the P well 2A and the $N^-$-type diffused layer 21 than between the P well 2A and the $N^+$-type diffused layer 3Ba. Accordingly, the voltage V1b by which the voltage increases until snap-back occurs after breakdown occurs becomes lower than V1a where the $N^-$-type diffused layer 21 is absent as seen in FIG. 7. In short, by decreasing the maximum value of the current to flow after breakdown from I1a to I1b, production of hot carriers can be suppressed and the reliability of the transistors can be further augmented.

Similar effects to those described above can be achieved also when a surge is applied as a positive or negative voltage with respect to the VDD terminal 19 to the input/output terminal 18.

Figure 9:
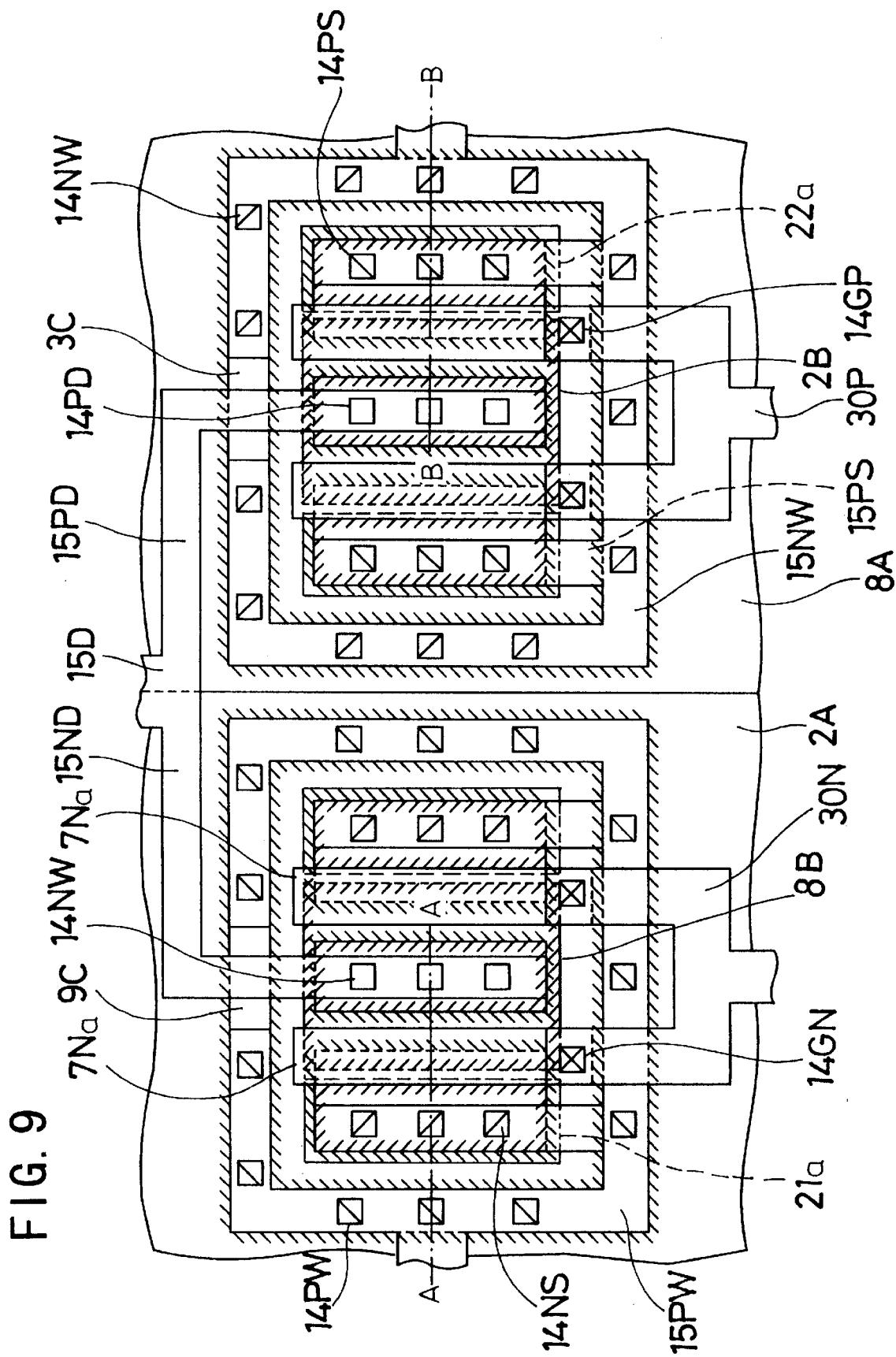
FIG. 9 is a plan view of a further semiconductor device including an input/output protection circuit showing a third preferred embodiment of the present invention.
Figure 10:
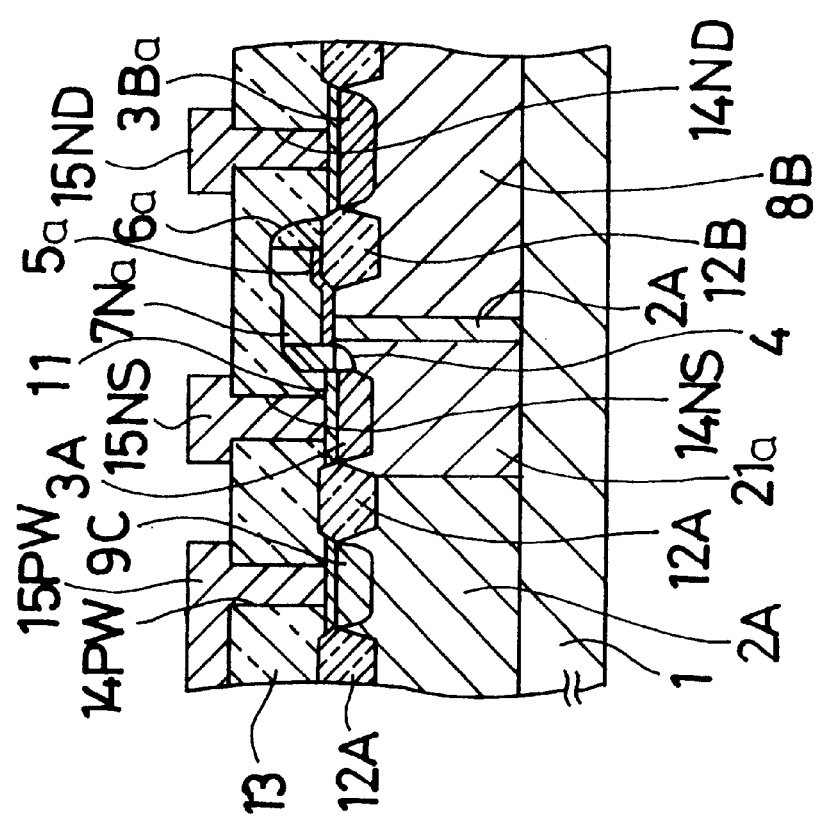
FIGS. 10(a) and 10(b) are sectional views taken along lines A—A and B—B of FIG. 9, respectively.

Referring now to FIGS. 9, 10(a) and 10(b), there is shown a further input/output protection circuit of a further semiconductor device to which the present invention is applied. The input/output protection circuit in the present embodiment is a modification to and is different from the input/output protection circuit in the second embodiment described above in that an $N^-$-type diffused layer 21a is formed in contact with bottom faces and side faces of the $N^+$-type diffused layer 3A which provides the source regions of the N-channel transistors such that it extends to locations below the gate electrodes 7Pa while a $P^-$-type diffused layer 22a is provided in contact with bottom faces and side faces of the $P^+$-type diffused layer 9A which provides source regions of the P-channel transistors such that it extends to locations below the gate electrodes 7Pa.

Operation of the input/output protection circuit when an external surge is applied is same as that of the input/output protection circuit in the second embodiment described above. However, since the $N^-$-type diffused layer 21a and the $P^-$-type diffused layer 22a are expanded to the locations below the gate electrodes of the transistors, the forward PN junctions are more ready to be turned on after breakdown of the individual transistors, and consequently, the voltage increase until snap-back occurs further decreases. Accordingly, by decreasing the distance between the N well 8B and the $N^-$-type diffused layer 21a and the distance between the P well 2B and the $P^-$-type diffused layer 22a to such a degree that punch-through does not occur before the forward PN junctions are turned on, production of current and hot carriers before snap-back occurs after breakdown occurs can be suppressed to further augment the reliability of the transistors.

While the input/output protection circuits in which both of an N-channel transistor and a P-channel transistor are provided are described above, it is possible to provide only one of such transistors in accordance with the necessity.

Subsequently, methods of producing the input/output protection circuits in the embodiments described above are described. In the input/output protection circuit in the first embodiment, the N wells 8A and 8B are formed simultaneously, and also the P wells 2A and 2B are formed simultaneously. In the meantime, in the input/output protection circuits in the second and third embodiments, the $N^-$-type diffused layer 21 or 21a and the $P^-$-type diffused layer 22 or 22a may be formed by additional steps of formation of a predetermined photo-resist mask and ion implantation. However, if the $N^-$-type diffused layer 21 or 21a is formed simultaneously with the N wells 8A and 8B and the P⁻-type diffused layer 22 or 22a is formed simultaneously with the P wells 2A and 2B, then no production step need be additionally provided. In this instance, the methods of producing the input/output protection circuits in the first, second and third embodiments are same except the formation of the N⁻-type diffused layer 21 or 21a and the P⁻-type diffused layer 22 or 22a, and therefore, the method of producing the input/output protection circuit in the third embodiment of the present invention is described in detail here.

Figure 13:
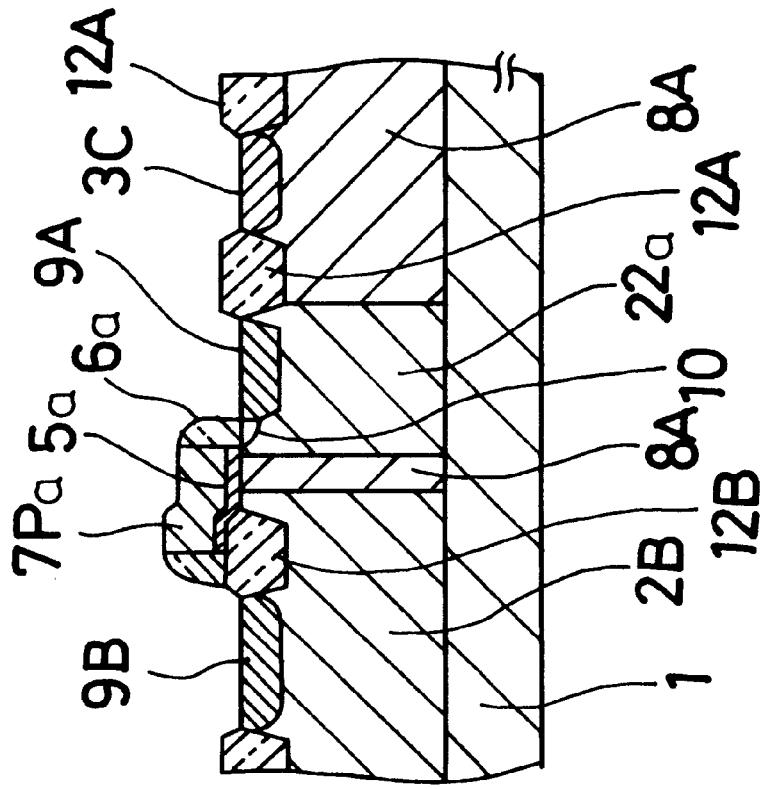
Figure 13:
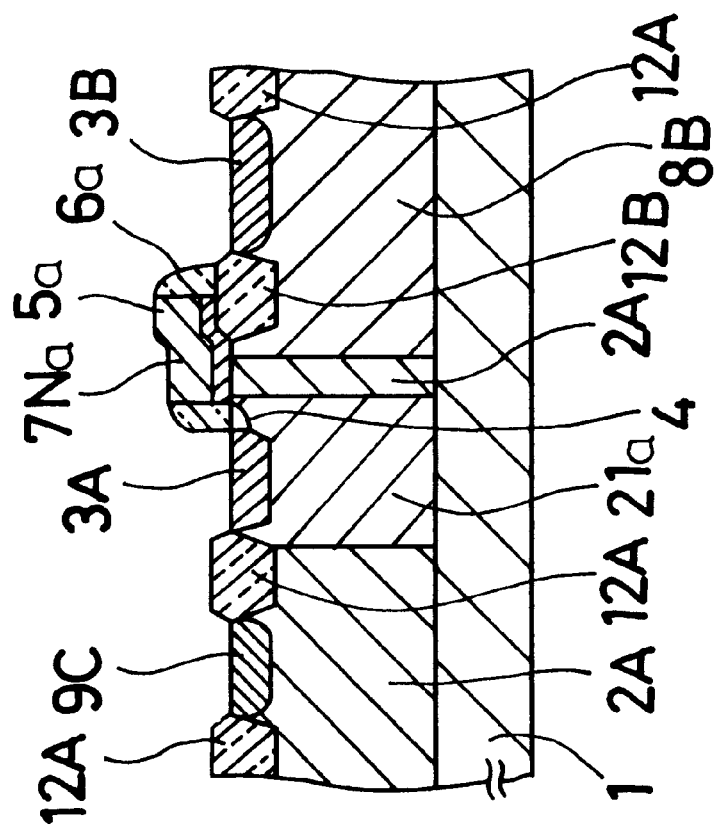

First, as shown in FIGS. 11(a) and 11(b), the surface of the P-type silicon semiconductor substrate 1 is selectively oxidized to form a silicon oxide film of 500 nm thick as the field oxide film 12A and the insulation regions 12B and 12C, and then, while predetermined locations are masked with a photo-resist film 23, ions of phosphor are implanted as an N-type impurity 24 to form the N wells 8A and 8B and the N⁻-type diffused layer 21a of approximately 2 μm deep. Then, as shown in FIGS. 12(a) and 12(b), while predetermined locations are masked with a photo-resist film 25, ions of boron are implanted as a P-type impurity 26 to form the P wells (2A, 2B) and the P⁻-type diffused layer 22a of approximately 2 microns thick. Thereafter, as shown in FIGS. 13(a) and 13(b), the surface of the P-type silicon semiconductor substrate 1 is oxidized to form the gate insulating film 5a of 10 nm thick, and then a polycrystalline silicon film containing phosphor as an impurity is grown on the surface of the gate insulating film 5a by a CVD method, whereafter it is patterned to form gate electrodes 7Na and 7Pa at predetermined locations. Then, the N⁻-type diffused layer 4 and the P⁻-type diffused layer 10 are formed and side wall spacers 6a are formed on the gate electrodes 7Na and 7Pa, whereafter ion implantation is selectively performed to form the N⁺-type diffused layer 3A, 3B and 3C and the P⁺-type diffused layers 9A, 9B and 9C. Thereafter, as shown in FIGS. 9, 10(a) and 10(b), the titanium silicide layer 11 is formed by reaction of a Ti film in a self-aligned relationship on the surfaces of the N⁺-type diffused layers 3A, 3B, 3C and the P⁺-type diffused layers 9A, 9B and 9C, and then a silicon oxide film of approximately 1 μm thick is formed as the inter-layer insulating film 13. The contact holes 14ND and so forth are perforated at predetermined locations of the inter-layer insulating film 13, and then another inter-layer insulating film not shown and the contact holes 14GN and 14GP are formed, whereafter the metal wires 30N of the second layer and so forth are formed, thereby completing a semiconductor device including input/output protection circuits and internal circuits.

While the foregoing description relates to a case wherein the second diffused layer of the second conduction type is a well, since it is required only to have a lower impurity concentration than the first and third diffused layers of the second conduction type and have a suitable depth, a special step therefor may be additionally provided.

Figure 14:
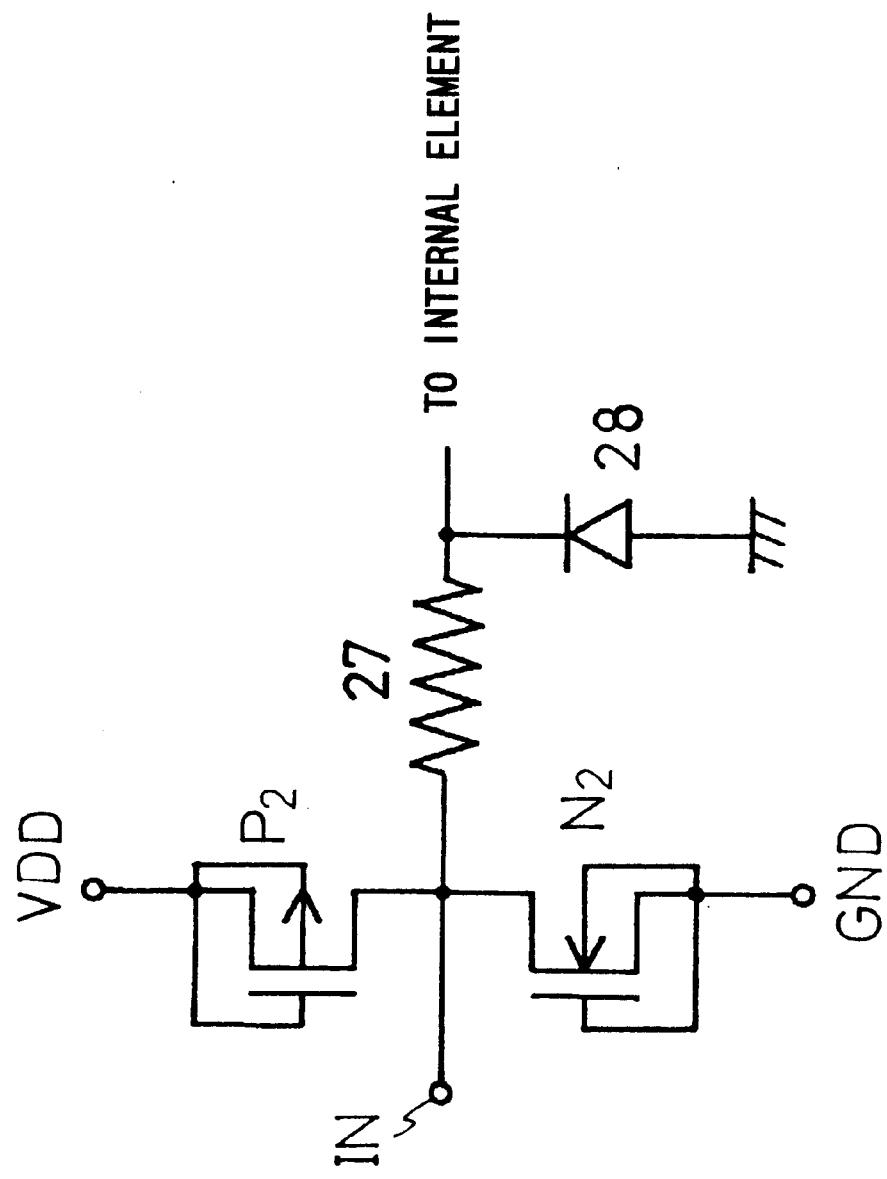
FIG. 14 is a circuit diagram showing an input/output protection circuit showing a fourth preferred embodiment of the present invention.

While the input/output protection circuits in the first, second and third embodiments and the methods of producing them are described above, a still further input/output protection circuit of a still further semiconductor device to which the present invention is applied is described. FIG. 14 shows in circuit diagram the input/output protection circuit according to the fourth preferred embodiment of the present invention. Referring to FIG. 14, both or one of MOS transistors P2 and N2 has a structure described hereinabove in connection with the input/output protection circuit in the first, second or third embodiment, and a resistor 27 is a resistance element formed from, for example, a polycrystalline silicon film. A diode 28 is a voltage clamping element in the form of, for example, a PN junction formed between a diffused layer and a well.

Figure 4:
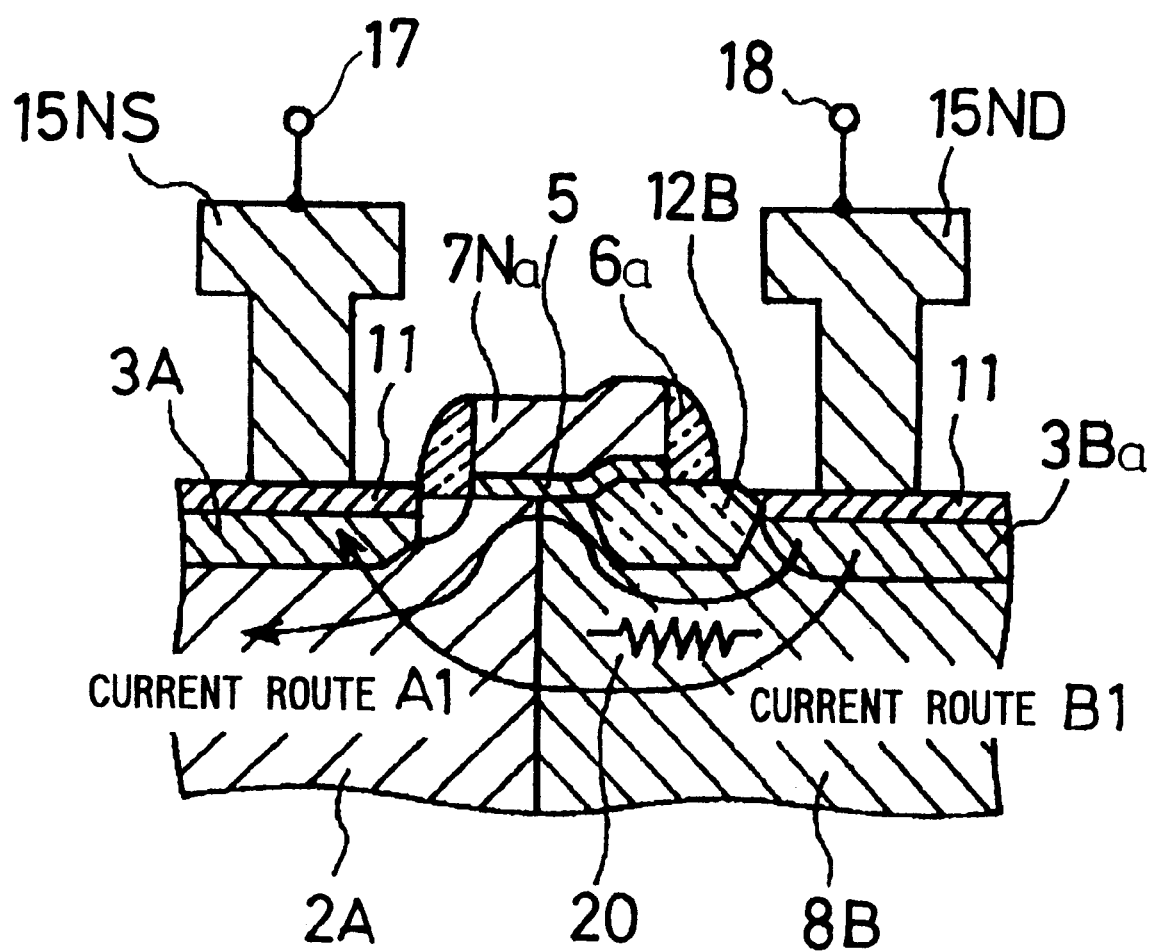
FIG. 4 is a sectional view illustrating a route of current when breakdown of a transistor shown in FIG. 1 occurs.

Subsequently, operation of the input/output protection circuit is described. With the transistor structure in the input/output protection circuits in the first, second and third embodiments, since the drain has a parasitic resistance 20 of the N well, for example, as illustrated in FIG. 4, the characteristic illustrated in FIG. 3 exhibits the relationship of V2a>VBa, where the drain of the input protection element is connected to the gate electrode of an internal element like an input circuit, there is the possibility that a voltage of V2a in the maximum may be applied to the gate electrode of the internal element, and as V2 becomes particularly high, there is the possibility that the gate insulation breakdown of the internal element may occur. Therefore, by forming the diode 28, which breaks down with a voltage lower than V2a, between the input protection element and the internal element and providing the resistor 27 between the input protection element and the diode 28, the voltage to be applied to the internal element can be clamped with the breakdown voltage of the diode 28 irrespective of the value of V2a. In this instance, current flows through the resistor 27 due to a difference between the drain voltage of the input protection element and the withstanding voltage of the diode 28.

Having now fully described the invention, it will be apparent to one of ordinary skill in the art that many changes and modifications can be made thereto without departing from the spirit and scope of the invention as set forth herein.

What is claimed is:

1. A semiconductor device, comprising:
   a plurality of circuit elements formed on a semiconductor substrate;
   a field oxide film selectively provided on said semiconductor substrate for electrically isolating said circuit elements from one another;
   an input terminal for supplying an external signal to a first one of said circuit elements;
   an output terminal for supplying a signal from a second one of said circuit elements to the outside; and
   a pair of protection elements interposed between said first circuit element and said input terminal and between said second circuit element and said output terminal for protecting said circuit elements from an external surge;
   each of said protection elements including a plurality of MOS transistors arranged in parallel and each including a source region which includes a first diffused layer of a second conduction type selectively formed on a surface of a region of a first conduction type of a surface portion of said semiconductor substrate and a first metal silicide layer formed on a surface of said first diffused layer of the second conduction type, a source electrode connected to said first metal silicide layer, a drain region including a second diffused layer of the second conduction type provided in an opposing relationship to and extending deeper than said first diffused layer of the second conduction type at least on a surface portion of said region of the first conduction type, a third diffused layer of the second conduction type formed on a surface portion of said second diffused layer of the second conduction type and containing an impurity in a concentration higher than that of the surface portion of said second diffused layer of the second conduction type and a second metal silicide layer provided on a surface of said third diffused layer of the second conduction type, a drain electrode connected to said second metal silicide layer, an insulation region formed between said first diffused layer of the second conduction type and said third diffused layer of the second conduction type and extending from the surface of said second diffused layer of the second conduction type to a predetermined depth, and a gate electrode covering over the surface of said semiconductor substrate between said first diffused layer of the second conduction type and said insulation region with a gate insulating film interposed therebetween.

2. A semiconductor device as claimed in claim 1, wherein each of said MOS transistors which form said protection elements is connected at said gate electrode and said source electrode thereof to a same power supply terminal, and a parasitic resistance along a current route from said drain electrode to said first diffused layer of the second conduction type when an excessively high voltage is applied to said drain electrode is increased by provision of said second diffused layer of the second conduction type so that a thermal breakdown voltage thereof is set higher than a withstanding voltage of said drain electrode.

3. A semiconductor device as claimed in claim 1, wherein channel lengths of said MOS transistors which form said protection elements are set shorter than three times the smallest channel length of MOS transistors which form said circuit elements.

4. A semiconductor device as claimed in claim 1, further comprising a fourth diffused layer of the second conduction provided in contact with at least a bottom face of said first diffused layer of the second conduction type and having a concentration lower than that of said first diffused layer of the second conduction type.

5. A semiconductor device as claimed in claim 4, wherein said fourth diffused layer of the second conductor type surrounds said first diffused layer of the second conduction type.

6. A semiconductor device as claimed in claim 1, wherein said second diffused layer of the second conduction type is formed simultaneously with a well of the second conductor type.

7. A semiconductor device as claimed in claim 4, wherein said fourth diffused layer of the second conduction type is formed simultaneously with a well of the second conduction type.

8. A semiconductor device as claimed in claim 2, further comprising a resistance element connected at an end thereof to the drain electrode of each of said MOS transistors which form said protection elements, and a clamping diode element interposed between the other end of said resistance element and the source electrode of the MOS transistor and having a withstanding voltage lower than a breakdown voltage of the MOS transistor.

9. A semiconductor device as claimed in claim 2, wherein channel lengths of said MOS transistors which form said protection elements are set shorter than three times the smallest channel length of MOS transistors which form said circuit elements.

10. A semiconductor device as claimed in claim 2, wherein said second diffused layer of the second conduction type is formed simultaneously with a well of the second conductor type.

11. A semiconductor device as claimed in claim 4, wherein said second diffused layer of the second conduction type is formed simultaneously with a well of the second conductor type.

12. A semiconductor device as claimed in claim 5, wherein said second diffused layer of the second conduction type is formed simultaneously with a well of the second conductor type.

13. A semiconductor device as claimed in claim 5, wherein said fourth diffused layer of the second conduction type is formed simultaneously with a well of the second conduction type.

* * * * *